United States Patent
Lee et al.

(10) Patent No.: US 11,600,677 B2
(45) Date of Patent: Mar. 7, 2023

(54) THIN FILM TRANSISTOR ARRAY SUBSTRATE AND ELECTRONIC DEVICE INCLUDING THE SAME

(71) Applicant: LG Display Co., Ltd., Seoul (KR)

(72) Inventors: Dohyung Lee, Gyeonggi-do (KR); ChanYong Jeong, Gyeonggi-do (KR); JuHeyuck Baeck, Gyeonggi-do (KR)

(73) Assignee: LG DISPLAY CO., LTD., Seoul (KR)

( * ) Notice: Subject to any disclaimer, the term of this patent is extended or adjusted under 35 U.S.C. 154(b) by 69 days.

(21) Appl. No.: 17/122,811

(22) Filed: Dec. 15, 2020

(65) Prior Publication Data

US 2021/0183975 A1    Jun. 17, 2021

(30) Foreign Application Priority Data

Dec. 16, 2019   (KR) .......................... 10-2019-0167813

(51) Int. Cl.
| | |
|---|---|
| *H01L 27/00* | (2006.01) |
| *H01L 29/00* | (2006.01) |
| *H01L 27/32* | (2006.01) |
| *H01L 29/786* | (2006.01) |
| *H01L 29/24* | (2006.01) |
| *H01L 27/12* | (2006.01) |

(52) U.S. Cl.
CPC ...... *H01L 27/3262* (2013.01); *H01L 27/3272* (2013.01); *H01L 27/1225* (2013.01); *H01L 29/24* (2013.01); *H01L 29/7869* (2013.01); *H01L 29/78633* (2013.01)

(58) Field of Classification Search
CPC ............ H01L 27/3272; H01L 27/1222; H01L 27/3262; H01L 27/1225; H01L 29/78633; H01L 29/24; H01L 29/7869
See application file for complete search history.

(56) References Cited

U.S. PATENT DOCUMENTS

| | | | |
|---|---|---|---|
| 10,008,614 B1* | 6/2018 | He ..................... | H01L 29/1054 |
| 10,290,658 B2* | 5/2019 | Koo ................... | H01L 27/1251 |
| 10,475,868 B2* | 11/2019 | Park .................. | H01L 27/3276 |
| 10,840,274 B2* | 11/2020 | Lee ................... | G02F 1/133345 |
| 2018/0175077 A1* | 6/2018 | Koo .................. | H01L 27/3272 |
| 2018/0204896 A1* | 7/2018 | Park .................. | H01L 27/3262 |
| 2018/0286891 A1* | 10/2018 | Lee ................... | H01L 27/1248 |

* cited by examiner

*Primary Examiner* — Nikolay K Yushin
(74) *Attorney, Agent, or Firm* — Polsinelli PC

(57) ABSTRACT

A thin film transistor (TFT) array substrate for an electronic device includes a first active layer of a first TFT which is an oxide semiconductor layer including molybdenum, a second active layer of a second TFT which is an oxide semiconductor layer and disposed on a buffer layer to be spaced apart from the first active layer of the first TFT, a first gate insulating film overlapping the first active layer and the second active layer, a first gate electrode of the first TFT overlapping the first gate insulating film and a part of the first active layer, and a second gate electrode of the second TFT overlapping the first gate insulating film, spaced apart from the first gate electrode, and overlapping a part of the second active layer. Accordingly, the first TFT has a high subthreshold parameter, and the second TFT has high mobility.

21 Claims, 18 Drawing Sheets

THIN FILM TRANSISTOR ARRAY SUBSTRATE AND ELECTRONIC DEVICE INCLUDING THE SAME

CROSS-REFERENCE TO RELATED APPLICATION

This application claims priority from Korean Patent Application No. 10-2019-0167813, filed on Dec. 16, 2019, which is hereby incorporated by reference in its entirety.

BACKGROUND

Field of the Disclosure

The present disclosure relates to a thin film transistor (TFT) array substrate and an electronic device including the same.

Description of the Background

With the development of information societies, demands for various electronic devices, such as display devices and lighting devices, are increasing in various forms. Such an electronic device may include a panel in which data lines and gate lines are disposed, a data driver for driving the data lines, and a gate driver for driving the gate lines.

In the panel which is the core of the electronic device, numerous transistors having various functions may be disposed to drive the panel.

For this reason, a panel manufacturing process is complicated and difficult to manage. Accordingly, pursuing convenience of processing may cause degradation in the device performance of transistors.

In particular, it is difficult to design a transistor having a structure that satisfies requirements for a plurality of transistors which function differently.

SUMMARY

Accordingly, the present disclosure is directed to providing a thin film transistor (TFT) array substrate in which at least one of a plurality of TFTs disposed on a substrate includes molybdenum (Mo) in an active layer and thus has a high subthreshold (S) parameter and an electronic device including the TFT array substrate.

Also, the present disclosure is directed to providing a TFT array substrate in which at least one of a plurality of TFTs disposed on a substrate has sufficient mobility and thus facilitates signal transfer and an electronic device including the TFT array substrate.

In an aspect of the present disclosure, there is provided an electronic device including a panel including at least one first TFT and at least one second TFT and a driving circuit for driving the panel. The panel includes a buffer layer disposed on a substrate of the panel, a first active layer of the first TFT which is an oxide semiconductor layer including molybdenum and disposed on the buffer layer, a second active layer of the second TFT which is an oxide semiconductor layer and disposed on the buffer layer to be spaced apart from the first active layer of the first TFT, a first gate insulating film overlapping the first active layer and the second active layer, a first gate electrode of the first TFT overlapping the first gate insulating film and a part of the first active layer, and a second gate electrode of the second TFT overlapping the first gate insulating film, spaced apart from the first gate electrode, and overlapping a part of the second active layer.

In another aspect of the present disclosure, there is provided a TFT array substrate including a buffer layer disposed on a substrate, a first active layer of a first TFT which is an oxide semiconductor layer including molybdenum and disposed on the buffer layer, a second active layer of a second TFT which is an oxide semiconductor layer and disposed on the buffer layer to be spaced apart from the first active layer of the first TFT, a first gate insulating film overlapping the first active layer and the second active layer, a first gate electrode of the first TFT overlapping the first gate insulating film and a part of the first active layer, and a second gate electrode of the second TFT overlapping the first gate insulating film, spaced apart from the first gate electrode, and overlapping a part of the second active layer.

According to aspects of the present disclosure, it is possible to provide a TFT array substrate in which at least one of a plurality of TFTs disposed on a substrate includes molybdenum (Mo) in an active layer and thus has a high subthreshold (S) parameter and an electronic device including the TFT array substrate.

Also, according to aspects of the present disclosure, it is possible to provide a TFT array substrate in which at least one of a plurality of TFTs disposed on a substrate has sufficient mobility and thus facilitates signal transfer and an electronic device including the TFT array substrate.

BRIEF DESCRIPTION OF THE DRAWINGS

The above and other features and advantages of the present disclosure will be more apparent from the following detailed description taken in conjunction with the accompanying drawings, in which.

DETAILED DESCRIPTION

Figure 1:
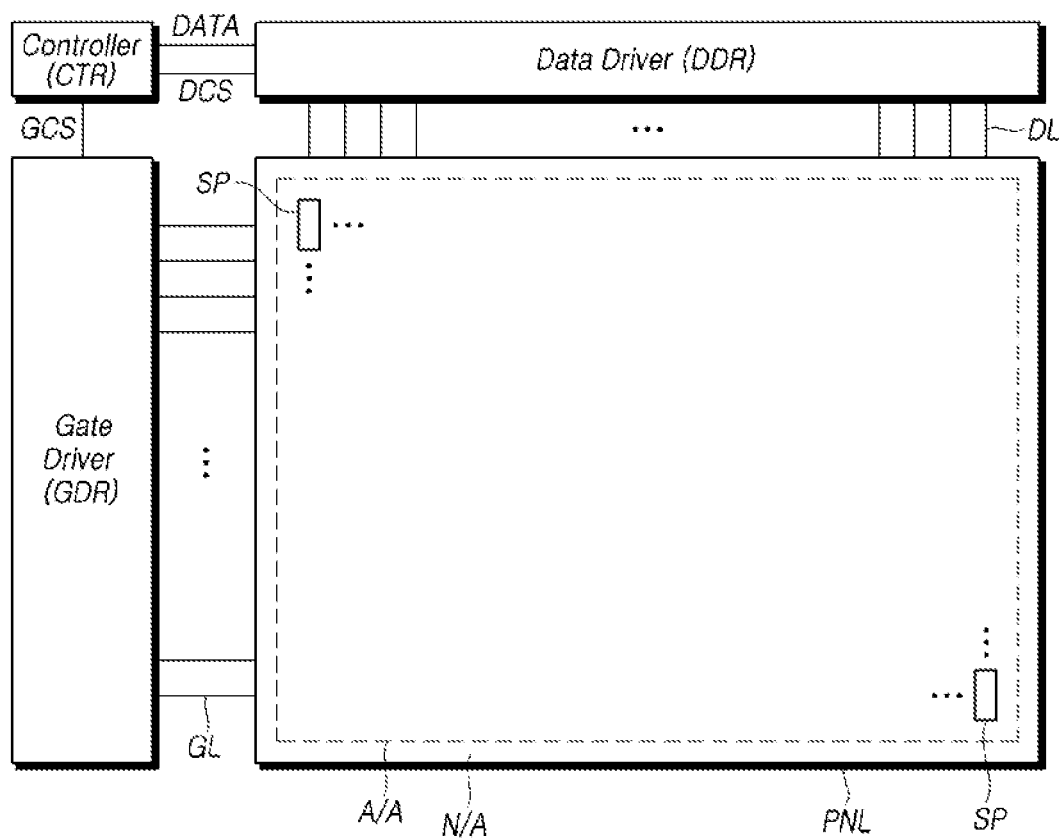
FIG. 1 is a diagram schematically illustrating a configuration of an electronic device according to aspects of the present disclosure.

In the following description of examples or aspects of the present disclosure, reference will be made to the accompanying drawings in which it is shown by way of illustration specific examples or aspects that can be implemented, and in which the same reference numerals and signs can be used to designate the same or like components even when they are shown in different accompanying drawings from one another. Further, in the following description of examples or aspects of the present disclosure, detailed descriptions of well-known functions and components incorporated herein will be omitted when it is determined that the descriptions may make the subject matter in some aspects of the present disclosure rather unclear. The terms such as "including," "having," "containing," "constituting," "make up of," and "formed of" used herein are generally intended to allow other components to be added unless the terms are used with the term "only." As used herein, singular forms are intended to include plural forms unless the context clearly indicates otherwise.

Terms, such as "first," "second," "A," "B," "(A)," or "(B)" may be used herein to describe elements of the present disclosure. Each of these terms is not used to define essence, order, sequence, or number of elements etc., but is used merely to distinguish the corresponding element from other elements.

When it is mentioned that a first element "is connected or coupled to," "contacts or overlaps," etc. a second element, it should be interpreted that, not only can the first element "be directly connected or coupled to" or "directly contact or overlap" the second element, but a third element can also be "interposed" between the first and second elements, or the first and second elements can "be connected or coupled to," "contact or overlap," etc. each other via a fourth element. Here, the second element may be included in at least one of two or more elements that "are connected or coupled to," "contact or overlap," etc. each other.

When time relative terms, such as "after," "subsequent to," "next," "before," and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes, etc. are mentioned, it should be considered that numerical values for elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can."

Hereinafter, aspects of the present disclosure will be described in detail with reference to the accompanying drawings.

FIG. 1 is a diagram schematically illustrating a configuration of an electronic device according to aspects of the present disclosure.

The electronic device according to the aspects of the present disclosure may include a display device, a lighting device, a light-emitting device, and the like. For convenience of description, a display device will be mainly described below. However, the present disclosure may be applied to various other electronic devices, such as a lighting device and a light-emitting device, in the same way as long as a transistor is included.

The electronic device according to the aspects of the present disclosure may include a panel PNL for displaying an image or outputting light and a driving circuit for driving the panel PNL.

In the panel PNL, a plurality of data lines DL and a plurality of gate lines GL may be disposed, and a plurality of subpixels SP defined by the plurality of data lines DL and the plurality of gate lines GL may be arranged in a matrix form.

In the panel PNL, the plurality of data lines DL and the plurality of gate lines GL may be arranged to cross each other. For example, the plurality of gate lines GL may be arranged in rows or columns, and the plurality of data lines DL may be arranged in columns or rows. For convenience of description, it is assumed below that the plurality of gate lines GL are disposed in rows and the plurality of data lines DL are disposed in columns.

In the panel PNL, in addition to the plurality of data lines DL and the plurality of gate lines GL, other kinds of signal lines may be disposed according to a subpixel structure and the like. Driving voltage lines, reference voltage lines, common voltage lines, or the like may be additionally disposed.

The panel PNL may be one of various types of panels such as a liquid crystal display (LCD) panel and an organic light-emitting diode (OLED) panel.

The types of signal lines disposed in the panel PNL may vary depending on a subpixel structure, a panel type (e.g., an LCD panel or an OLED panel), and the like. In this specification, signal lines may include electrodes to which signals are applied.

The panel PNL may include an active area A/A in which a video (images) is displayed and a non-active area (N/A) which is an outer area of the active area A/A and does not display a video. The non-active area N/A may also be referred to as a "bezel area."

In the active area A/A, the plurality of subpixels SP for video display are disposed.

In the non-active area N/A, a pad section to which a data driver DDR is electrically connected may be disposed, and a plurality of data link lines for connecting the pad section and the plurality of data lines DL may also be disposed. The plurality of data link lines may be parts of the plurality of data lines DL extending to the non-active area N/A or additional patterns electrically connected to the plurality of data lines DL.

In the non-active area N/A, gate driving-related lines may be disposed to transfer a voltage (a signal) required for gate driving to a gate driver GDR through the pad section to which the data driver DDR is electrically connected. For example, the gate driving-related lines may include clock lines for transferring a clock signal, gate voltage lines for transferring gate voltages VGH and VGL, gate-driving control signal lines for transferring various control signals required for generating scan signals, and the like. These gate driving-related lines are disposed in the non-active area N/A unlike the gate lines GL disposed in the active area A/A.

The driving circuit may include the data driver DDR for driving the plurality of data lines DL, the gate driver GDR for driving the plurality of gate lines GL, a controller CTR for controlling the data driver DDR and the gate driver GDR, and the like.

The data driver DDR may drive the plurality of data lines DL by outputting data voltages to the plurality of data lines DL.

The gate driver GDR may drive the plurality of gate lines GL by outputting scan signals to the plurality of gate lines GL.

The controller CTR may control an operation of driving the data driver DDR and the gate driver GDR by supplying various control signals DCS and GCS required for the operation of driving the data driver DDR and the gate driver GDR. Also, the controller CTR may supply image data DATA to the data driver DDR.

The controller CTR begins scanning according to the timing of each frame, converts input image data, which is input from the outside, into a data signal format used in the data driver DDR to output the converted image data DATA, and controls data driving at an appropriate time for scanning.

To control the data driver DDR and the gate driver GDR, the controller CTR receives timing signals, such as a vertical synchronization signal Vsync, a horizontal synchronization signal Hsync, an input data enable (DE) signal, and a clock signal CLK, from the outside (e.g., a host system), and generates and outputs various control signals to the data driver DDR and the gate driver GDR.

For example, to control the gate driver GDR, the controller CTR outputs various gate control signals GCS including a gate start pulse (GSP), a gate shift clock (GSC), a gate output enable (GOE) signal, and the like.

Also, to control the data driver DDR, the controller CTR outputs various data control signals DCS including a source start pulse (SSP), a source sampling clock (SSC), a source output enable (SOE) signal, and the like.

The controller CTR may be a timing controller used in general display technology or a control device which may perform other control functions in addition to those of a timing controller.

The controller CTR may be implemented as an element separate from the data driver DDR or may be integrated with the data driver DDR to be implemented as an integrated circuit.

The data driver DDR receives the image data DATA from the controller CTR and supplies data voltages to the plurality of data lines DL, thereby driving the plurality of data lines DL. The data driver DDR is also referred to as a "source driver."

The data driver DDR may transmit various signals to the controller CTR and receive various signals from the controller CTR through various interfaces.

The gate driver GDR sequentially drives the plurality of gate lines GL by sequentially supplying scan signals to the plurality of gate lines GL. The gate driver GDR is also referred to as a "scan driver."

The gate driver GDR sequentially supplies scan signals having an on-voltage or an off-voltage to the plurality of gate lines GL under the control of the controller CTR.

When a specific gate line is activated by the gate driver GDR, the data driver DDR converts the image data DATA received from the controller CTR into analog data voltages and supplies the analog data voltages to the plurality of data lines DL.

The data driver DDR may be disposed on only one side (e.g., an upper side or a lower side) of the panel PNL or disposed on both sides (e.g., the upper side and the lower side) of the panel PNL according to a driving method, a panel design method, etc. in some cases.

The gate driver GDR may be disposed on only one side (e.g., a left side or a right side) of the panel PNL or disposed on both sides (e.g., the left side and the right side) of the panel PNL according to a driving method, a panel design method, etc. in some cases.

The data driver DDR may include one or more source driver integrated circuits SDIC.

Each of the source driver integrated circuits SDIC may include a shift register, a latch circuit, a digital-to-analog converter (DAC), an output buffer, and the like. In some cases, the data driver DDR may further include one or more analog-to-digital converters (ADCs).

Each of the source driver integrated circuits SDIC may be connected to a bonding pad of the panel PNL in a tape automated bonding (TAB) type or chip-on-glass (COG) type or disposed directly on the panel PNL. In some cases, each of the source driver integrated circuits SDIC may be integrated with the panel PNL. Also, each of the source driver integrated circuits SDIC may be implemented in a chip-on-film (COF) type. In this case, each of the source driver integrated circuits SDIC may be mounted on a circuit film and electrically connected to the data lines DL in the panel PNL through the circuit film.

The gate driver GDR may include a plurality of gate driving circuits GDC. The plurality of gate driving circuits GDC may correspond to the plurality of gate lines GL, respectively.

Each of the gate driving circuits GDC may include a shift register, a level shifter, and the like.

Each of the gate driving circuits GDC may be connected to the bonding pad of the panel PNL in a TAB type or COG type. Also, each of the gate driving circuits GDC may be implemented in a COF type. In this case, each of the gate driving circuits GDC may be mounted on the circuit film and electrically connected to the gate lines GL in the panel PNL through the circuit film. Also, each of the gate driving circuits GDC may be implemented in a gate-in-panel (GIP) type and embedded in the panel PNL. In other words, each of the gate driving circuits GDC may be formed directly in the panel PNL.

Figure 2:
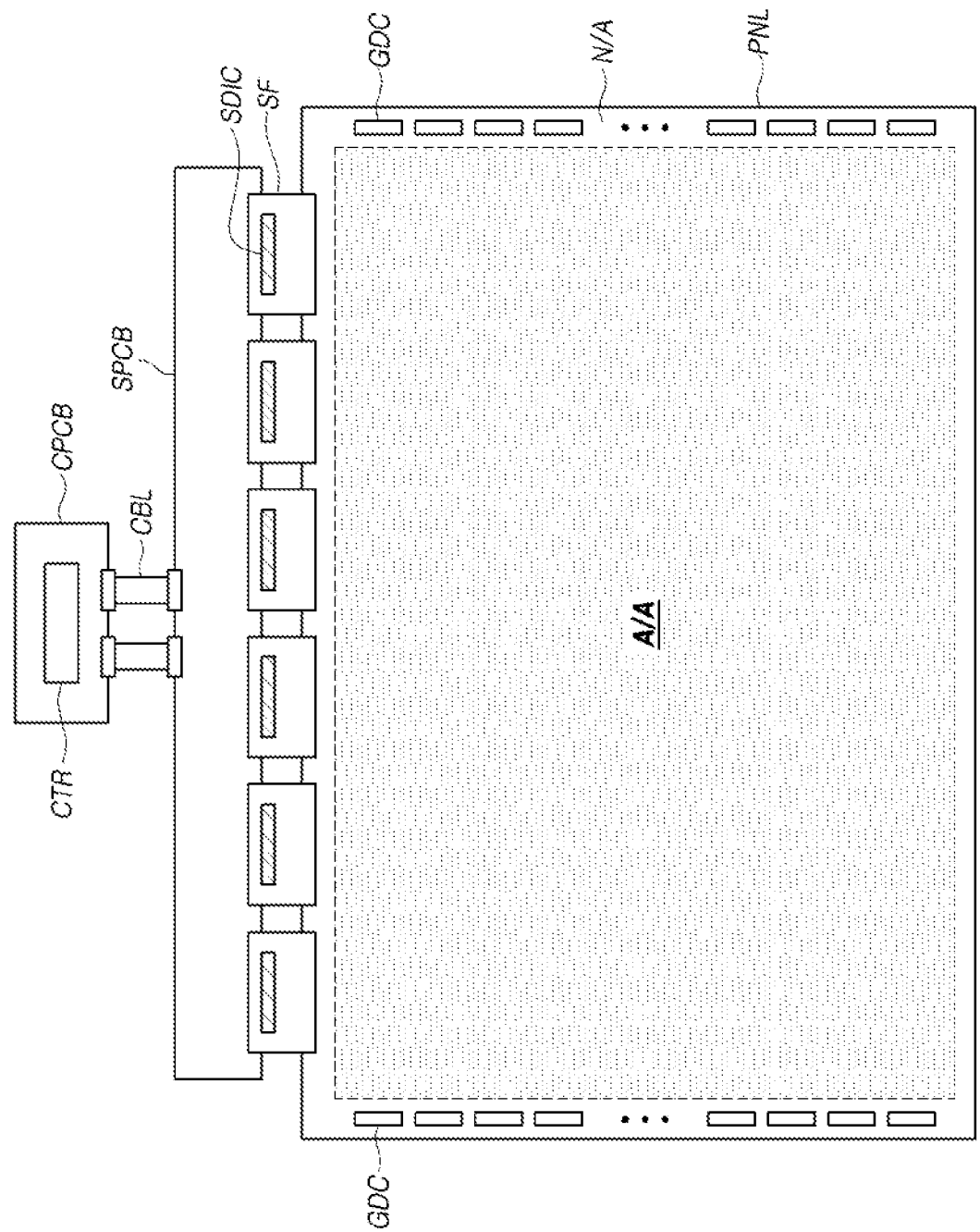
FIG. 2 is an exemplary diagram of system implementation of the electronic device according to the aspects of the present disclosure.

FIG. 2 is an exemplary diagram of system implementation of the electronic device according to the aspects of the present disclosure.

Referring to FIG. 2, in the electronic device according to the aspects of the present disclosure, the data driver DDR may be implemented in a COF type among various types (TAB, COG, COF, etc.), and the gate driver GDR may be implemented in a GIP type among various types (TAB, COG, COF, GIP, etc.).

The data driver DDR may be implemented as one or more source driver integrated circuits SDIC. FIG. 2 shows an example in which the data driver DDR is implemented as a plurality of source driver integrated circuits SDIC.

When the data driver DDR is implemented in a COF type, each of the source driver integrated circuits SDIC for implementing the data driver DDR may be mounted on a source-side circuit film SF.

One side of the source-side circuit film SF may be electrically connected to the pad section (a set of pads) present in the non-active area N/A.

On the source-side circuit film SF, lines may be disposed to electrically connect the source driver integrated circuit SDIC to the panel PNL.

The electronic device may include at least one source printed circuit board SPCB for circuit connection between the plurality of source driver integrated circuits SDIC and other devices and may include a control printed circuit board CPCB for mounting control parts and various electrical devices.

The other side of the source-side circuit film SF on which the source driver integrated circuit SDIC is mounted may be connected to the at least one source printed circuit board SPCB.

In other words, the one side of the source-side circuit film SF on which the source driver integrated circuit SDIC is mounted may be electrically connected to the non-active area N/A of the panel PNL, and the other side thereof may be electrically connected to the source printed circuit board SPCB.

On the control printed circuit board CPCB, the controller CTR for controlling operations of the data driver DDR, the gate driver GDR, etc. may be disposed.

Also, a power management integrated circuit (PMIC) and the like may be additionally disposed on the control printed circuit board CPCB to supply various voltages or currents to the panel PNL, the data driver DDR, the gate driver GDR, etc. or control the various voltages or currents to be supplied thereto.

The source printed circuit board SPCB and the control printed circuit board CPCB may be connected through at least one connecting member CBL in a circuit. As an example, the connecting member CBL may be a flexible printed circuit (FPC), a flexible flat cable (FFC), or the like.

The at least one source printed circuit board SPCB and the control printed circuit board CPCB may be integrated into one printed circuit board.

When the gate driver GDR is implemented in a GIP type, the plurality of gate driving circuits GDC included in the gate driver GDR may be formed directly in the non-active area N/A of the panel PNL.

Each of the plurality of gate driving circuits GDC may output a corresponding scan signal SCAN to a corresponding gate line GL disposed in the active area A/A of the panel PNL.

The plurality of gate driving circuits GDC disposed on the panel PNL may be supplied with various signals (a clock signal, a high-level gate voltage VGH, a low-level gate voltage VGL, a start signal VST, a reset signal RST, etc.) required for generating scan signals through the gate driving-related lines disposed in the non-active area N/A.

The gate driving-related lines disposed in the non-active area N/A may be electrically connected to the source-side circuit films SF disposed closest to the plurality of gate driving circuits GDC.

Figure 3:
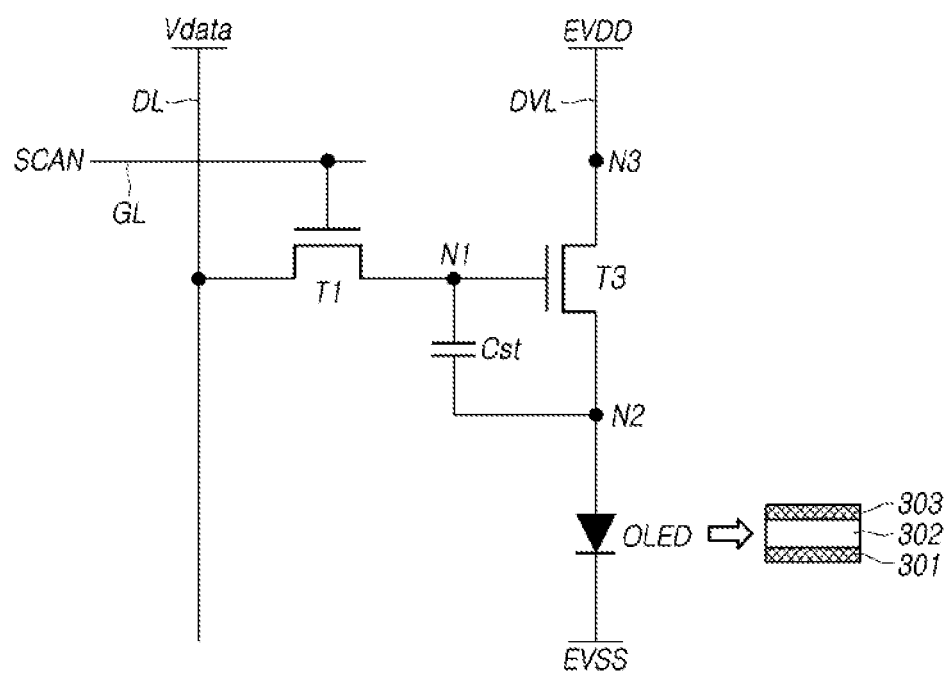
FIG. 3 is a diagram illustrating a structure of a subpixel when a panel according to the aspects of the present disclosure is an organic light-emitting diode (OLED) panel.

FIG. 3 shows a structure of a subpixel SP when the panel PNL according to the aspects of the present disclosure is an OLED panel.

Referring to FIG. 3, in the panel PNL which is an OLED panel, each subpixel SP may further include a first transistor T1 for transferring a data voltage Vdata to a first node N1 corresponding to a gate node of a driving transistor T3 and a storage capacitor Cst for maintaining the data voltage Vdata corresponding to an image signal voltage or a voltage corresponding to the data voltage Vdata for one frame time.

An organic light-emitting diode OLED may include a first electrode (an anode or a cathode) 301, an organic layer 302 including at least one light-emitting layer, a second electrode (a cathode or an anode) 303, and the like.

For example, a base voltage EVSS may be applied to the second electrode 303 of the organic light-emitting diode OLED.

The driving transistor T3 drives the organic light-emitting diode OLED by supplying a driving current to the organic light-emitting diode OLED.

The driving transistor T3 may include the first node N1, a second node N2, and a third node N3.

The first node N1 of the driving transistor T3 may be a node corresponding to the gate node and electrically connected to a source node or a drain node of the first transistor T1.

The second node N2 of the driving transistor T3 may be electrically connected to the first electrode 301 of the organic light-emitting diode OLED and may be the source node or the drain node.

A driving voltage EVDD may be applied to the third node N3 of the driving transistor T3. The third node N3 may be electrically connected to a driving voltage line DVL which supplies the driving voltage EVDD and may be the drain node or the source node.

The driving transistor T3 and the first transistor T1 may be implemented as n-type transistors or p-type transistors.

The first transistor T1 may be electrically connected between the data line DL and the first node N1 of the driving transistor T3 and may be controlled by receiving the scan signal SCAN at the gate node through a gate line.

The first transistor T1 may be turned on by the scan signal SCAN and transfer the data voltage Vdata supplied from the data line DL to the first node N1 of the driving transistor T3.

The storage capacitor Cst may be electrically connected between the first node N1 and the second node N2 of the driving transistor T3.

The storage capacitor Cst may be an external capacitor, which is intentionally designed outside the driving transistor T3, rather than a parasitic capacitor (e.g., Cgs or Cgd), which is an internal capacitor present between the first node N1 and the second node N2 of the driving transistor T3.

Each subpixel structure illustrated in FIG. 3 is a two-transistor one-capacitor (2T1C) structure which is only an example for description. Each subpixel structure may further include one or more transistors or further include one or more capacitors in some cases. Alternatively, each of the plurality of subpixels may have the same structure, or some of the plurality of subpixels may have a different structure.

Figure 4:
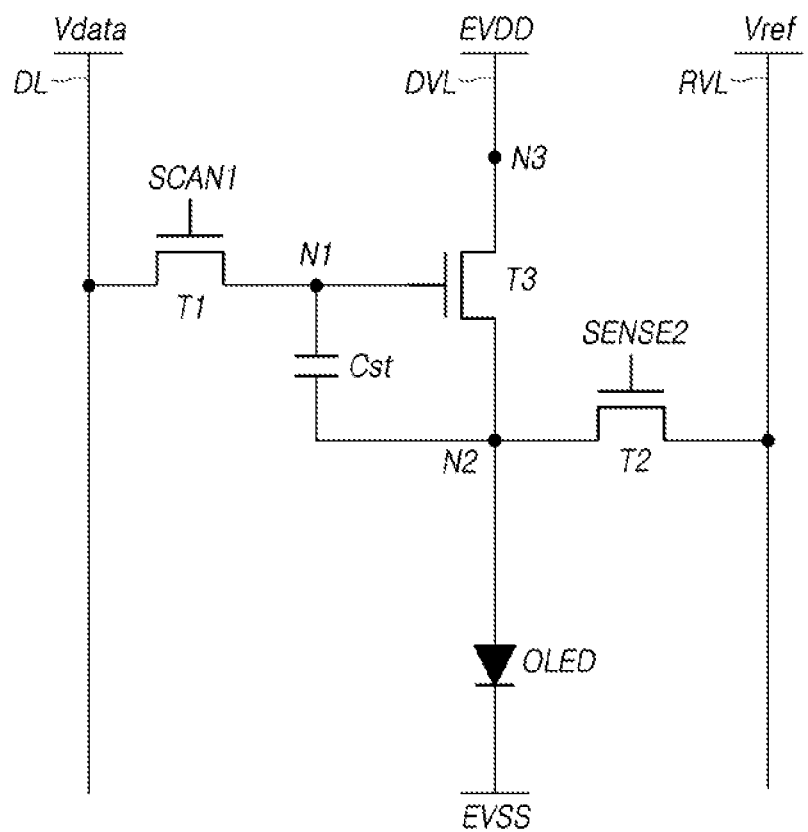
FIG. 4 is a diagram illustrating an example of a three-transistor one-capacitor (3T1C) structure in which one subpixel further includes a second transistor electrically connected between a second node of a driving transistor and a reference voltage line.

FIG. 4 is a diagram illustrating an example of a three-transistor one-capacitor (3T1C) structure in which one subpixel SP further includes a second transistor T2 electrically connected between the second node N2 of the driving transistor T3 and a reference voltage line RVL.

Referring to FIG. 4, the second transistor T2 may be electrically connected between the second node N2 of the driving transistor T3 and the reference voltage line RVL and receive a second scan signal SCAN2 at the gate node so that turning the second transistor T2 on or off may be controlled.

A drain node or a source node of the second transistor T2 may be electrically connected to the reference voltage line RVL, and the source node or the drain node of the second transistor T2 may be electrically connected to the second node N2 of the driving transistor T3.

For example, the second transistor T2 may be turned on during a display operation time period and turned on during a sensing operation time period for sensing a characteristic value of the driving transistor T3 or a characteristic value of the organic light-emitting diode OLED.

The second transistor T2 may be turned on by the second scan signal SCAN2 according to a corresponding driving timing (e.g., a display driving timing or an initialization timing in the sensing operation time period) and transfer a reference voltage Vref supplied to the reference voltage line RVL to the second node N2 of the driving transistor T3.

Also, the second transistor T2 may be turned on by the second scan signal SCAN2 according to a corresponding driving timing (e.g., a sampling timing in the sensing operation time period) and transfer the voltage of the second node N2 of the driving transistor T3 to the reference voltage line RVL.

In other words, the second transistor T2 may control the voltage of the second node N2 of the driving transistor T3 or transfer the voltage of the second node N2 of the driving transistor T3 to the reference voltage line RVL.

The reference voltage line RVL may be electrically connected to an ADC which senses and converts the voltage of the reference voltage line RVL into a digital value and outputs sensing data including the digital value.

The ADC may be included in the source driver integrated circuit SDIC by which the data driver DDR is implemented.

The sensing data output from the ADC may be used to sense a characteristic value (e.g., a threshold value, mobility, or the like) of the driving transistor T3 or a characteristic value (e.g., a threshold value or the like) of the organic light-emitting diode OLED.

Meanwhile, the capacitor Cst may be an external capacitor, which is intentionally designed outside the driving transistor T3, rather than a parasitic capacitor (e.g., Cgs or Cgd), which is an internal capacitor present between the first node N1 and the second node N2 of the driving transistor T3.

Each of the driving transistor T3, the first transistor T1, and the second transistor T2 may be an n-type transistor or a p-type transistor.

Meanwhile, a first scan signal SCANT and the second scan signal SCAN2 may be separate gate signals. In this case, the first scan signal SCANT and the second scan signal SCAN2 may be applied to the gate node of the first transistor T1 and the gate node of the second transistor T2 through different gate lines, respectively.

In some cases, the first scan signal SCANT and the second scan signal SCAN2 may be identical gate signals. In this case, the first scan signal SCANT and the second scan signal SCAN2 may be applied in common to the gate node of the first transistor T1 and the gate node of the second transistor T2 through the same gate line.

The subpixel structures illustrated in FIGS. 3 and 4 are only examples for description. The subpixel structures may further include one or more transistors or, in some cases, further include one or more capacitors.

Alternatively, each of the plurality of subpixels may have the same structure, or some of the plurality of subpixels may have a different structure.

Figure 5:
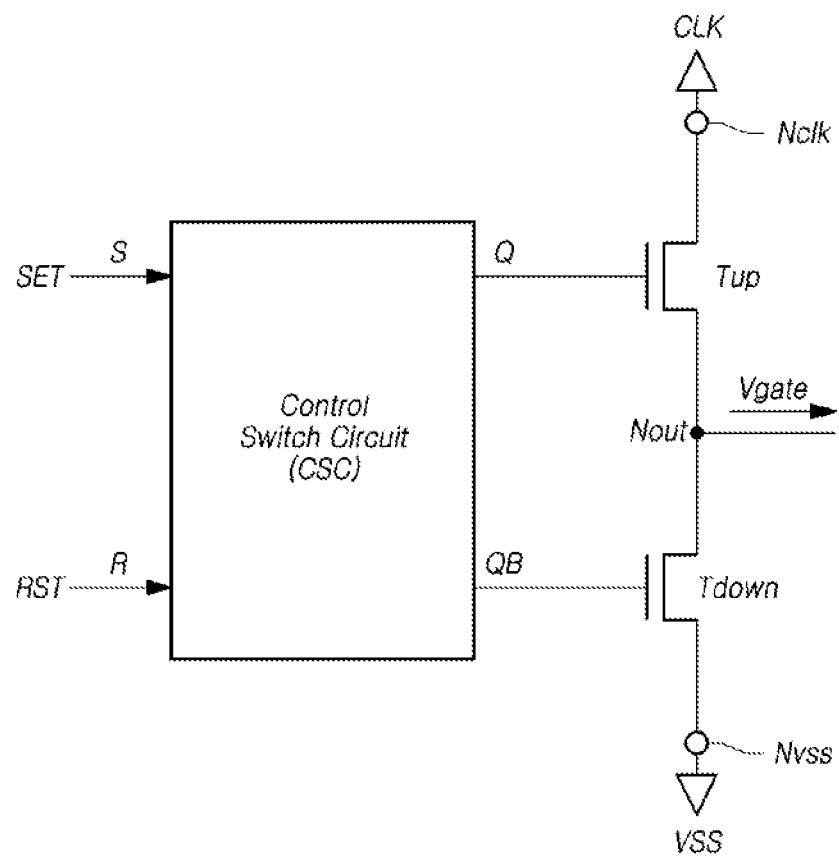
FIG. 5 is a diagram schematically illustrating a gate driving circuit disposed in the panel according to the aspects of the present disclosure.

FIG. 5 is a diagram schematically illustrating the gate driving circuit GDC disposed in the panel PNL according to the aspects of the present disclosure.

Referring to FIG. 5, each gate driving circuit GDC may include a pull-up transistor Tup, a pull-down transistor Tdown, a control switch circuit CSC, and the like.

The control switch circuit CSC is a circuit which controls a voltage of a node Q corresponding to a gate node of the pull-up transistor Tup and a voltage of a node QB corresponding to a gate node of the pull-down transistor Tdown and may include several switches (transistors).

The pull-up transistor Tup supplies a gate signal Vgate corresponding to a first level voltage (e.g., a high level voltage VGH) to a gate line GL through a gate signal output node Nout. The pull-down transistor Tdown supplies the gate signal Vgate corresponding to a second level voltage (e.g., a low level voltage VGL) to the gate line GL through the gate signal output node Nout. The pull-up transistor Tup and the pull-down transistor Tdown may be turned on at different timings.

The pull-up transistor Tup is electrically connected between a clock signal application node Nclk to which the clock signal CLK is applied and the gate signal output node Nout electrically connected to the gate line GL and is turned on or off by the voltage of the node Q.

The gate node of the pull-up transistor Tup is electrically connected to the node Q. A drain node or a source node of the pull-up transistor Tup is electrically connected to the clock signal application node Nclk. The source node or the drain node of the pull-up transistor Tup is electrically connected to the gate signal output node Nout from which the gate signal Vgate is output.

The pull-up transistor Tup is turned on by the voltage of the node Q and outputs the gate signal Vgate, which has the high level voltage VGH in a high level period of the clock signal CLK, to the gate signal output node Nout.

The gate signal Vgate of the high level voltage VGH output to the gate signal output node Nout is supplied to the corresponding gate line GL.

The pull-down transistor Tdown is electrically connected between the gate signal output node Nout and a base voltage node Nvss and turned on or off by the voltage of the node QB.

The gate node of the pull-down transistor Tdown is electrically connected to the node QB. A drain node or a source node of the pull-down transistor Tdown is electrically connected to the base voltage node Nvss, and a base voltage VSS which is a constant voltage is applied to the drain node or the source node of the pull-down transistor Tdown. The source node or the drain node of the pull-down transistor Tdown is electrically connected to the gate signal output node Nout from which the gate signal Vgate is output.

The pull-down transistor Tdown is turned on by the voltage of the node QB and outputs the gate signal Vgate of the low level voltage VGL to the gate signal output node Nout. Accordingly, the gate signal Vgate of the low level voltage VGL may be supplied to the corresponding gate line GL through the gate signal output node Nout. As an example, the gate signal Vgate of the low level voltage VGL may be the base voltage VSS.

Meanwhile, the control switch circuit CSC may include two or more transistors and the like, and main nodes, such as the node Q, the node QB, a set node S (also referred to as a "start node"), and a reset node R, are present therein. In some cases, an input node to which various voltages, such as a driving voltage VDD, are input may be additionally present in the control switch circuit CSC.

In the control switch circuit CSC, the node Q is electrically connected to the gate node of the pull-up transistor Tup and is repeatedly charged and discharged.

In the control switch circuit CSC, the node QB is electrically connected to the gate node of the pull-down transistor Tdown and is repeatedly charged and discharged.

In the control switch circuit CSC, a set signal SET for instructing the corresponding gate driving circuit GDC to start gate driving is applied to the set node S.

The set signal SET applied to the set node S may be a start signal VST input from the outside of the gate driver GDR or a feedback signal (a carry signal) of a gate signal Vgate output from a gate driving circuit GDC in a previous stage of the current gate driving circuit GDC.

A reset signal RST applied to the reset node R in the control switch circuit CSC may be a reset signal for simultaneously initializing the gate driving circuits GDC in all stages or a carry signal input from another stage (the previous or following stage).

The control switch circuit CSC charges the node Q in response to the set signal SET and discharges the node Q in response to the reset signal RST. The control switch circuit CSC may include an inverter circuit to charge or discharge the node Q and the node QB at different timings.

As shown in FIG. 3, in each of the plurality of subpixels SP in the active area A/A of the panel PNL which is an OLED panel, the driving transistor T3 and the switching transistor T1 may be disposed. However, the present aspects are not limited thereto, and as shown in FIG. 4, three or more transistors may be disposed in each of the plurality of subpixels SP in the active area A/A of the panel PNL which is an OLED panel.

Also, when the gate driving circuit GDC is implemented in a GIP type as shown in FIG. 2, that is, when the gate driving circuit GDC is embedded in the panel PNL, various transistors (Tup, Tdown, and transistors in the control switch circuit CSC) included in the gate driving circuit GDC as shown in FIG. 5 may be disposed in the non-active area N/A which is an outer area of the active area A/A of the panel PNL.

Figure 6:
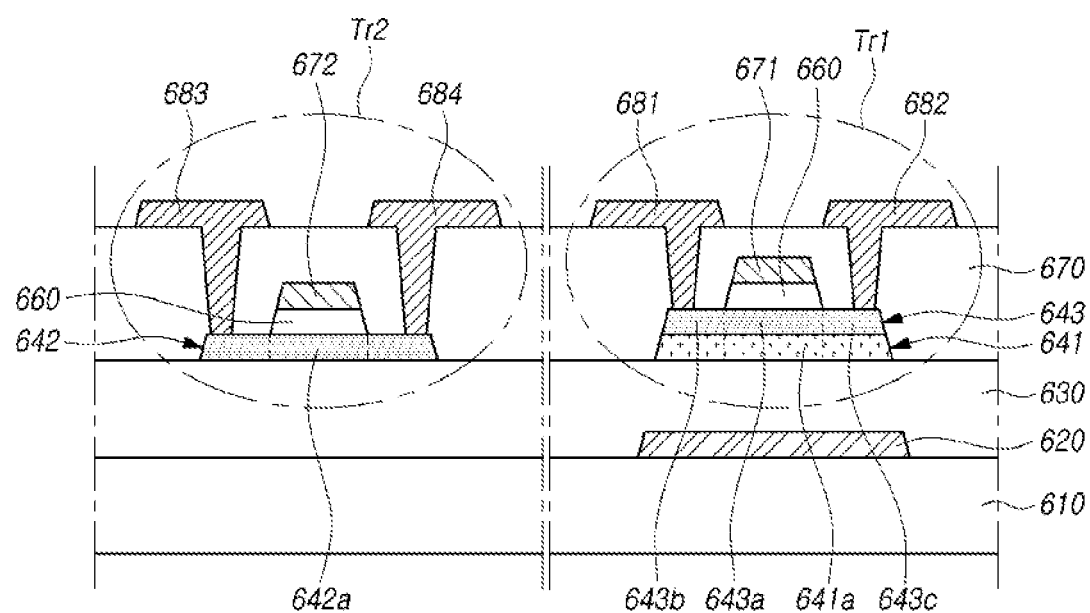
FIG. 6 is a cross-sectional view showing a structure of at least two thin film transistors (TFTs) disposed in the electronic device according to the aspects of the present disclosure.
Figure 7:
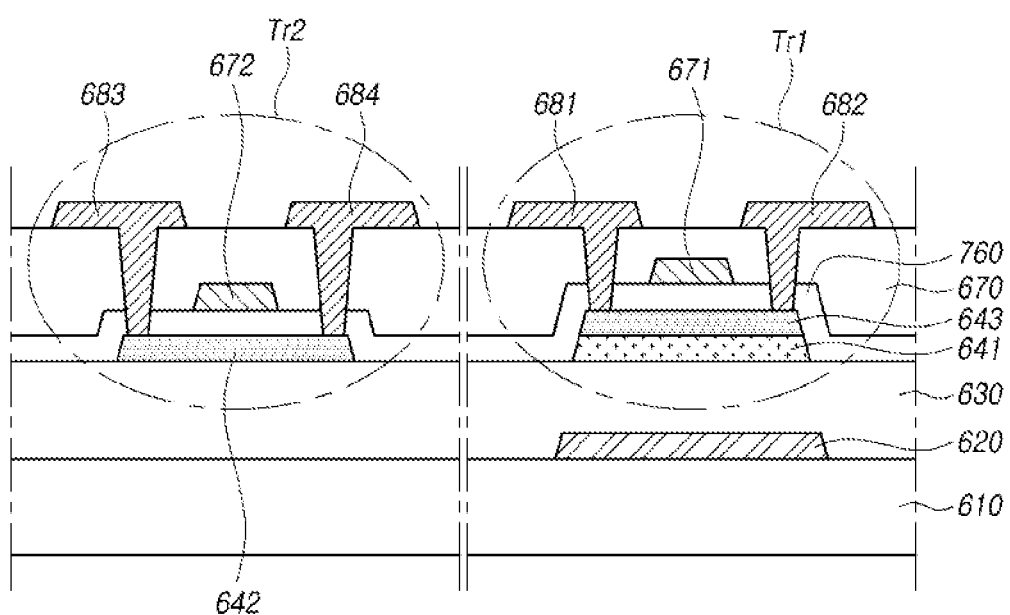
FIG. 7 is a cross-sectional view showing another structure of TFTs disposed in the electronic device according to the aspects of the present disclosure.

FIG. 6 is a cross-sectional view showing a structure of at least two thin film transistors (TFTs) disposed in the electronic device according to the aspects of the present disclosure. FIG. 7 is a cross-sectional view showing another structure of TFTs disposed in the electronic device according to the aspects of the present disclosure.

First, referring to FIG. 6, the electronic device according to the aspects of the present disclosure may include at least two TFTs Tr1 and Tr2. For example, the electronic device according to the aspects of the present disclosure may include a first TFT Tr1 and a second TFT Tr2 disposed on a substrate 610.

The first TFT Tr1 may include a first active layer 641, a third active layer 643, a first gate electrode 671, a first electrode 681, and a second electrode 682.

The second TFT Tr2 may include a second active layer 642, a second gate electrode 672, a third electrode 683, and a fourth electrode 684.

Specifically, at least one light-shield layer 620 may be disposed on the substrate 610.

The light-shield layer 620 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the present disclosure is not limited thereto.

Although the light-shield layer 620 is shown as a single layer in FIG. 6, the light-shield layer 620 may have a multi-layer structure.

A buffer layer 630 may be disposed on the light-shield layer 620. The buffer layer 630 may include an inorganic insulating material, such as silicon oxide (SiOx), silicon nitride (SiNx), or silicon oxynitride (SiON), but the present disclosure is not limited thereto.

In FIG. 6, the buffer layer 630 has a single layer structure, but the buffer layer 630 of the present disclosure may have a multi-layer structure.

When the buffer layer 630 has a multi-layer structure, layers including at least two inorganic materials among silicon oxide (SiOx), silicon nitride (SiNx), silicon oxynitride (SiON), etc. may be alternately disposed, but the present disclosure is not limited thereto.

In the following description, it is assumed that the buffer layer 630 has a single layer structure for convenience of description.

The first active layer 641 of the first TFT Tr1 and the second active layer 642 of the second TFT Tr2 may be disposed on the buffer layer 630. The first active layer 641 and the second active layer 642 may be disposed apart from each other on the same layer.

The third active layer 643 may be disposed on the first active layer 641 of the first TFT Tr1.

The first to third active layers 641 to 643 may be various types of semiconductor layers.

The first and third active layers 641 and 643 may be formed of an oxide semiconductor. The material of the first active layer 641 is a metal-oxide semiconductor which may be an oxide of a metal, such as molybdenum (Mo), zinc (Zn), indium (In), gallium (Ga), tin (Sn), or titanium (Ti), or a combination of a metal, such as molybdenum (Mo), zinc (Zn), indium (In), gallium (Ga), tin (Sn), or titanium (Ti), and an oxide thereof.

The second active layer 642 may be formed of an oxide semiconductor. The material of the second active layer 642 is a metal-oxide semiconductor which may be an oxide of a metal, such as zinc (Zn), indium (In), gallium (Ga), tin (Sn), or titanium (Ti), or a combination of a metal, such as zinc (Zn), indium (In), gallium (Ga), tin (Sn), or titanium (Ti), and an oxide thereof.

For example, the first to third active layers 641 to 643 may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO), but the present disclosure is not limited thereto. The first and third active layers 641 and 643 may include molybdenum oxide among the aforementioned oxide semiconductors.

A first gate insulating film 660 may be disposed on the third active layer 643 of the first TFT Tr1 and the second active layer 642 of the second TFT Tr2.

The first gate insulating film 660 may include an inorganic insulating material, such as silicon oxide (SiOx), silicon nitride (SiNx), or silicon oxynitride (SiON), but the present disclosure is not limited thereto.

As shown in FIG. 6, the first gate insulating film 660 may overlap a part of each of the first and third active layers 641 and 643 of the first TFT Tr1. Also, the first gate insulating film 660 may overlap a part of the second active layer 642 of the second TFT Tr2.

In other words, the first gate insulating film 660 may be disposed to expose a part of each of the first and third active layers 641 and 643 of the first TFT Tr1 and expose a part of the second active layer 642 of the second TFT Tr2. Also, the first gate insulating film 660 may be disposed to expose a part of an upper surface of the buffer layer 630 which is disposed under the first to third active layers 641 to 643 in the active area A/A.

The material of the first gate insulating film 660 formed on the substrate 610 is patterned by a dry etching process so that the first gate insulating film 660 may be finally formed on a part of an upper surface of each of the second active layer 642 and the third active layer 643.

During the process of dry-etching the material of the first gate insulating film 660, areas of the second active layer 642 and the third active layer 643 which correspond to an area of the material of the first gate insulating film 660 removed by patterning may be made conductive.

In other words, an area of the second active layer 642 and an area of the third active layer 643 exposed by (through) the first gate insulating film 660 may be a conductive area.

The second active layer 642 of the second TFT Tr2 may include a second channel area 642a disposed between conductive areas, and the third active layer 643 of the first TFT Tr1 may include a third channel area 643a disposed between conductive areas. The second channel area 642a and the third channel area 643a may have a higher electrical resistance than the conductive areas of the second and third active layers 642 and 643.

Also, the first active layer 641 of the first TFT Tr1 may have a first channel area 641a in an area overlapping the third channel area 643a of the third active layer 643. However, when the first TFT Tr1 is turned on, charges may move through the third channel area 643a of the third active layer 643.

When the second TFT Tr2 is turned on, charges may move through the second channel area 642a of the second active layer 642.

The first active layer 641 and the third active layer 643 of the first TFT Tr1 and the second active layer 642 of the second TFT Tr2 may have a thickness of 150 to 400 Å. The sum of the thicknesses of the first and third active layers 641 and 643 which are disposed to overlap each other may be 300 to 400 Å, but the present disclosure is not limited thereto.

When the active layer of each transistor has a thickness of less than 150 Å, it may be difficult to form the active layer having a uniform thickness over all areas. Also, when the active layer of each transistor has a thickness of greater than 400 Å, a molybdenum (Mo) content in an active layer including molybdenum (Mo) increases so that a subthreshold (S) parameter may be affected.

On the first gate insulating film 660 disposed on the third active layer 643 of the first TFT Tr1, the first gate electrode 671 of the first TFT Tr1 may be disposed.

On the first gate insulating film 660 disposed on the second active layer 642 of the second TFT Tr2, the second gate electrode 672 of the second TFT Tr2 may be disposed.

The first and second gate electrodes 671 and 672 may include any one of metals, such as aluminum (Al), gold (Au), silver (Ag), copper (Cu), tungsten (W), molybdenum (Mo), chromium (Cr), tantalum (Ta), and titanium (Ti), or alloys thereof, but the present disclosure is not limited thereto.

Although the first and second gate electrodes 671 and 672 are shown as a single layer in FIG. 6, the present disclosure is not limited thereto. At least one of the first and second gate electrodes 671 and 672 may have a multi-layer structure.

An insulating film 670 may be disposed on the substrate 610 on which the first and second gate electrodes 671 and 672 are disposed.

The insulating film 670 may include an inorganic insulating material, such as silicon oxide (SiOx), silicon nitride (SiNx), or silicon oxynitride (SiON), but the present disclosure is not limited thereto.

The first to fourth electrodes 681 to 684 may be disposed apart from each other on the insulating film 670.

Specifically, the first electrode 681 of the first TFT Tr1 and the second electrode 682 spaced apart from the first electrode 681 may be disposed on the insulating film 670. Meanwhile, one of the first electrode 681 and the second electrode 682 of the first TFT Tr1 may be a source electrode of the first TFT Tr1, and the other may be a drain electrode.

Each of the first and second electrodes 681 and 682 of the first TFT Tr1 may be connected to the conductive area of the third active layer 643 of the first TFT Tr1 through a contact hole provided in the insulating film 670.

For example, the third active layer 643 may include a first area 643b which is a conductive area and a second area 643c which is a conductive area and spaced apart from the first area 643b. The third channel area 643a may be disposed between the first area 643b and the second area 643c. The first electrode 681 may be electrically connected to the first area 643b, and the second electrode 682 may be electrically connected to the second area 643c.

Also, the third electrode 683 and the fourth electrode 684 of the second TFT Tr2 may be disposed apart from each other on the insulating film 670. Each of the third electrode 683 and the fourth electrode 684 of the second TFT Tr2 may be spaced apart from the first and second electrodes 681 and 682 of the first TFT Tr1. One of the third electrode 683 and the fourth electrode 684 of the second TFT Tr2 may be a source electrode of the second TFT Tr2, and the other may be a drain electrode.

Each of the third and fourth electrodes 683 and 684 of the second TFT Tr2 may be connected to the conductive area of the second active layer 642 of the second TFT Tr2 through a contact hole provided in the insulating film 670.

Meanwhile, FIG. 6 shows a structure in which the first gate insulating film 660 is disposed on a part of the upper surface of the third active layer 643 of the first TFT Tr1 and a part of the upper surface of the second active layer 642 of the second TFT Tr2, but the location of the first gate insulating film 660 disposed in the electronic device according to the aspects of the present disclosure is not limited thereto.

For example, as shown in FIG. 7, a first gate insulating film 760 may be disposed on the substrate 610 on which the third active layer 643 of the first TFT Tr1 and the second active layer 642 of the second TFT Tr2 are disposed. In other words, the first gate insulating film 760 may be disposed to cover the third active layer 643 of the first TFT Tr1 and the second active layer 642 of the second TFT Tr2.

In this case, each of the first and second electrodes 681 and 682 of the first TFT Tr1 may be connected to the third active layer 643 through a contact hole provided in the insulating film 670 and the first gate insulating film 760. Also, each of the third and fourth electrodes 683 and 684 of the second TFT Tr2 may be connected to the second active layer 642 through a contact hole provided in the insulating film 670 and the first gate insulating film 760.

The first TFT Tr1 may be disposed in the active area A/A of the electronic device, and a data voltage may be applied thereto. For example, the first TFT Tr1 may correspond to the driving transistor T3 of FIG. 3 or 4.

The second TFT Tr2 may be disposed in the active area A/A or the non-active area N/A of the electronic device.

When the second TFT Tr2 is disposed in the active area A/A of the electronic device, the second TFT Tr2 may be a transistor to which the scan signal is applied. For example, the second TFT Tr2 may be the first transistor T1 or the second transistor T2 shown in FIG. 3 or 4.

When the second TFT Tr2 is disposed in the non-active area N/A of the electronic device, the second TFT Tr2 may be a transistor provided in the gate driving circuit GDC. For example, the second TFT Tr2 may be the pull-up transistor Tup or the pull-down transistor Tdown of FIG. 5.

The first active layer 641 of the first TFT Tr1 may include molybdenum (Mo).

A molybdenum (Mo) content in the first active layer 641 of the first TFT Tr1 may be higher than a molybdenum (Mo) content in the third active layer 643 of the first TFT Tr1 and the second active layer 642 of the second TFT Tr2.

However, the present disclosure is not limited thereto, and the third active layer 643 of the first TFT Tr1 may have the same molybdenum (Mo) content as the first active layer 641.

In the following description, a configuration in which the first active layer 641 of the first TFT Tr1 has a higher molybdenum content than the third active layer 643 will be mainly described for convenience of description.

Meanwhile, the first TFT Tr1 which is a driving transistor requires a high S parameter. Specifically, a driving transistor determines the light intensity of an organic light-emitting device disposed in the active area A/A of the electronic device, and a large S parameter may facilitate control with a voltage applied to the driving transistor and representation of a low gray scale.

An S parameter may be obtained from an S-parameter graph. The S-parameter graph shows a ratio of a variation of the driving current of the driving transistor to a variation of the gate voltage. When the S-parameter graph of the driving transistor has a high gradient, an available data voltage has a small range, and thus representation of a low gray scale is difficult.

The gradient of the S-parameter graph may be 1/S-parameter.

In other words, the S parameter denotes how fast a channel potential is changed when the gate voltage is changed, and a large S parameter denotes that a channel potential is slowly changed in relation to a small S parameter, that is, charge is slowly accumulated when the transistor is turned on.

When the first TFT Tr1 is turned on, charge accumulation speed may be reduced by trapping a part of charge. In the aspects of the present disclosure, unstable molybdenum (Mo)-molybdenum (Mo) bonds included in the first active layer 641 of the first TFT Tr1 may act as defects in the band gap to trap charge.

On the other hand, the second TFT Tr2 which is not a driving transistor requires high operation speed, and thus a low S parameter is necessary. In other words, when the second TFT Tr2 is turned on, high charge accumulation speed is required, and to this end, a small number of defects which trap charge are present in the second active layer 642.

Accordingly, in the electronic device according to the aspects of the present disclosure, the first active layer 641 of the first TFT Tr1 may be doped with molybdenum (Mo) through a process, such as metal-organic chemical vapor deposition (MOCVD) or atomic layer deposition), to increase the S parameter of the first TFT Tr1.

MOCVD is a kind of chemical vapor deposition (CVD) in which a raw material gas including an organometallic complex is discharged on a high-temperature substrate to cause a decomposition reaction on the surface, thereby form a thin film. MOCVD is a technique for growing a thin film on a heated substrate or doping the heated substrate with a material by thermally decomposing an organometallic gas on the heated substrate. In the case of MOCVD, manipulation is performed at a lower temperature than in other CVD methods, such as plasma enhanced chemical vapor deposition (PECVD) and low pressure chemical vapor deposition (LPCVD), and control in an atomic order is possible.

ALD is a method of separately supplying raw materials for reaction and depositing particles formed through a chemical reaction between reactive gases on a substrate surface to form a thin film or dope the substrate with the particles. After one raw material for reaction is chemically adsorbed on a substrate or another element (here, the first active layer) disposed on the substrate, a second or third gas is introduced and chemically adsorbed again on the substrate or the other element disposed on the substrate so that a thin film is deposited or the material is doped.

When such MOCVD or ALD is used, an amount of raw material controlled for deposition or doping may be small compared with a general physical vapor deposition (PVD, e.g. sputtering) technique and another general CVD technique.

Also, when a metal material is deposited or doped, the metal may be deposited or doped without being oxidized. As described above, when the metal material is doped by MOCVD or ALD, it can be doped in an intermetallic state, and a small amount of metal oxide may also be doped at the same time.

For example, when the first active layer 641 of the first TFT Tr1 according to the aspects of the present disclosure is a three-component oxide thin film of indium-gallium-zinc oxide (IGZO), an indium (In) material, a gallium (Ga) material, and a zinc (Zn) material may be used for an MOCVD process.

As an example, the indium (In) material may be (3-dimethylaminopropyl)dimethylindium (DADI; $(CH_3)_2In(CH_2)_3N(CH_3)_2$), the gallium (Ga) material may be Trimethylgallium (TMGa), and the zinc (Zn) material may be diethylzinc (DEZ; $(C_2H_5)_2Zn$).

Each of the aforementioned indium (In), gallium (Ga), and zinc (Zn) materials may be vaporized and injected into a chamber in the form of gas and may be injected through a flow rate control member in different amounts depending on composition ratios thereof in the first active layer 641. Also, an atmosphere gas in the chamber, a temperature of the substrate, a pressure in the chamber, etc. may vary depending on composition ratios thereof in the first active layer 641.

To form the first active layer 641, vaporized (3-dimethylaminopropyl)dimethylindium (DADI; $(CH_3)_2In(CH_2)_3N(CH_3)_2$) may be injected into the chamber through a first supply module, vaporized Trimethylgallium (TMGa) may be injected into the chamber through a second supply module, and vaporized DEZ ($(C_2H_5)_2Zn$) may be injected into the chamber through a third supply module. Meanwhile, the present disclosure is not limited thereto, and at least two materials may be supplied to the chamber through the same supply module.

Each material may be injected into the chamber and sprayed on the substrate. Also, vaporized molybdenum hexacarbonyl (Mo(CO)6) may be sprayed on the substrate for doping with a small amount of molybdenum (Mo).

The sprayed amount of (3-dimethylaminopropyl)dimethylindium (DADI; (CH3)2In(CH2)3N(CH3)2), Trimethylgallium (TMGa), and DEZ ((C2H5)2Zn) may be higher than that of molybdenum hexacarbonyl (Mo(CO)6).

Through such a process, the first active layer 641 of the first TFT Tr1 may be doped with a small amount of molybdenum (Mo) by molybdenum (Mo)-molybdenum (Mo) bonding without being oxidized. In this process, not only the first active layer 641 of the first TFT Tr1 but also the bulk may be doped with molybdenum (Mo).

A molybdenum (Mo)-molybdenum (Mo) bond is unstable, and when the first active layer 641 which contains excess oxygen is doped with molybdenum (Mo), molybdenum (Mo)-molybdenum (Mo) bonds form defects in the band gap.

On the other hand, when the first active layer 641 is doped with oxidized molybdenum (2MoO3 (hexavalent molybdenum) or 3MoO2 (tetravalent molybdenum)) which is molybdenum in an oxidized state, molybdenum (Mo) is in a stable state and thus does not act as a defect in the band gap. Therefore, charge is not trapped in doped molybdenum (Mo) so that the S parameter is not increased.

It may be analyzed whether molybdenum (Mo) in the first active layer 641 is present in an unstable metallic bonding state or in a stable oxidized molybdenum state through X-ray photoelectron spectroscopy (XPS).

This will be described below with reference to FIG. 8A.

Figure 8A:
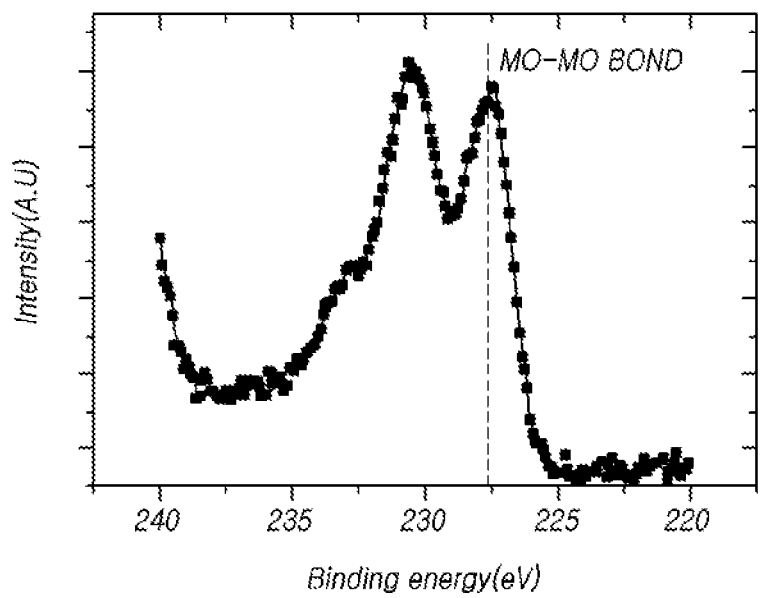
FIG. 8A is an X-ray photoelectron spectroscopy (XPS) graph obtained by analyzing a first active layer of a first TFT in the electronic device according to the aspects of the present disclosure after the first active layer is doped with molybdenum (Mo) by metal-organic chemical vapor deposition (MOCVD) or atomic layer deposition (ALD)

FIG. 8A is an XPS graph obtained by analyzing the first active layer of the first TFT in the electronic device according to the aspects of the present disclosure after the first active layer is doped with molybdenum (Mo) by MOCVD or ALD.

The molybdenum (Mo)-molybdenum (Mo) binding energy is about 227 eV.

As shown in FIG. 8A, when the binding energy is about 227 eV, a peak is high. Consequently, it can be seen that molybdenum (Mo) in the first active layer 641 is doped in a molybdenum (Mo)-molybdenum (Mo) bonding state.

Figure 8B:
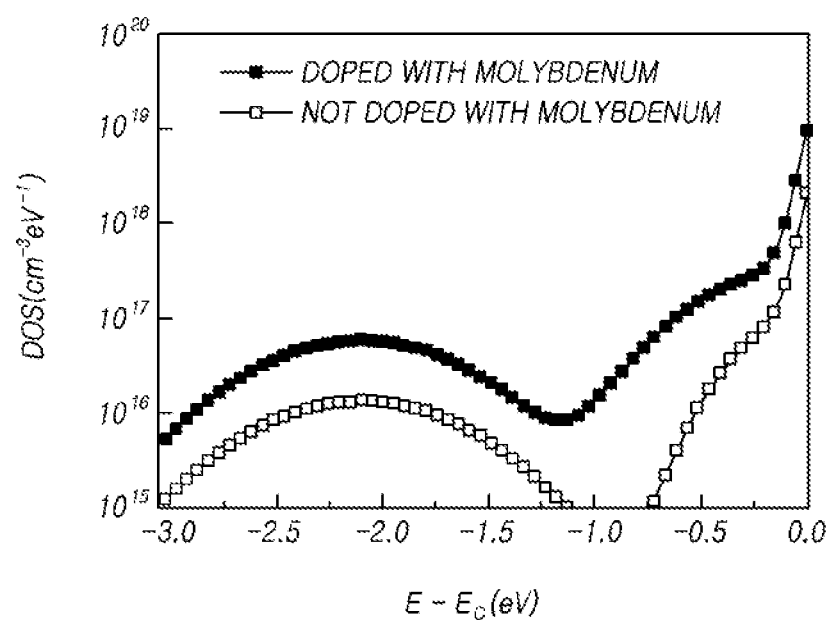
FIG. 8B is a graph obtained by measuring a change in the trap density in an active layer when the active layer is doped with molybdenum (Mo) having molybdenum (Mo)-molybdenum (Mo) bonds (intermetallic bonds)

FIG. 8B is a graph obtained by measuring a change in the trap density in an active layer when the active layer is doped with molybdenum (Mo) having molybdenum (Mo)-molybdenum (Mo) bonds (intermetallic bonds).

In the graph of FIG. 8B, the x-axis denotes an energy level in the band gap, and the y-axis denotes a trap density.

Referring to FIG. 8B, in the overall band gap energy level, a trap density is higher when molybdenum (Mo) having intermetallic bonds is doped than when molybdenum (Mo) is not doped.

Consequently, molybdenum (Mo) having intermetallic bonds acts as defects to trap charge.

Subsequently, an S parameter will be checked below with reference to FIGS. 9 and 10 when the first active layer 641 of the first TFT Tr1 is doped with a large amount of molybdenum (Mo) in a molybdenum (Mo)-molybdenum (Mo) bonding state and doped with a large amount of molybdenum (Mo) in an oxidized molybdenum bonding state.

Figure 9:
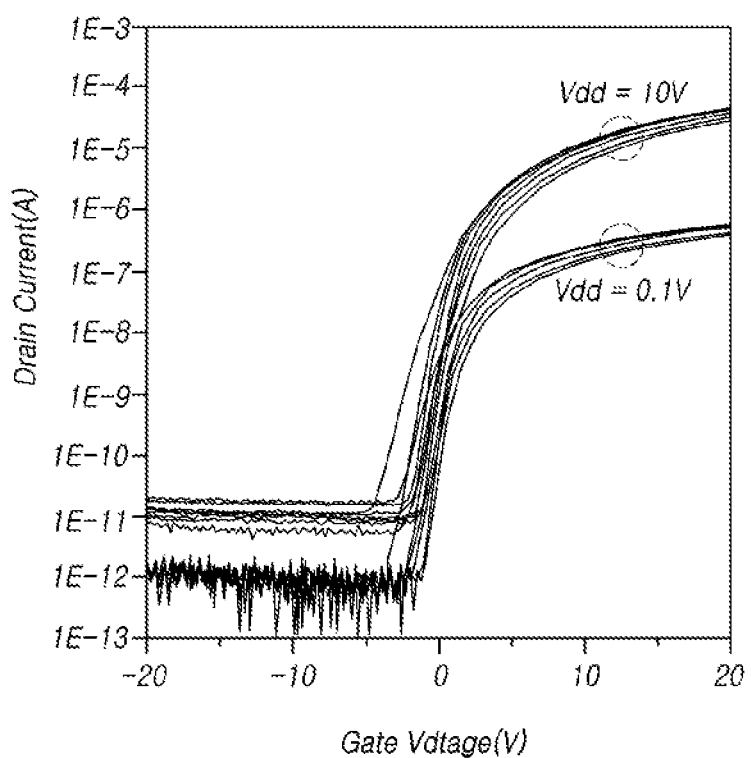
FIG. 9 shows a graph obtained by measuring a change in the drain current of the first TFT versus a change in the gate voltage after the first active layer of the first TFT according to the aspects of the present disclosure is doped with molybdenum by MOCVD or ALD and a table of mobility and a subthreshold (S) parameter.
Figure 10:
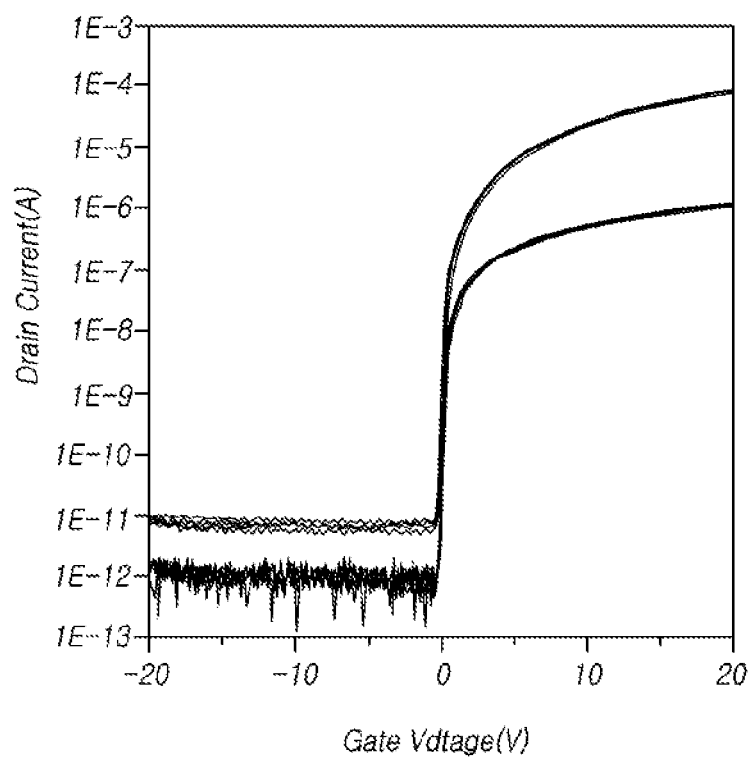
FIG. 10 shows a graph obtained by measuring a change in the drain current versus a change in the gate voltage of a TFT having the structure of a first TFT of FIG. 6 and in which the first active layer is doped with molybdenum by sputtering and a table of mobility and an S parameter.

FIG. 9 shows a graph obtained by measuring a change in the drain current of the first TFT versus a change in the gate voltage after the first active layer of the first TFT according to the aspects of the present disclosure is doped with molybdenum by MOCVD or ALD and a table of mobility and an S parameter. FIG. 10 shows a graph obtained by measuring a change in the drain current versus a change in the gate voltage of a TFT having the structure of the first TFT of FIG. 6 and in which the first active layer is doped with molybdenum by sputtering and a table of mobility and an S parameter.

When the first active layer 641 of the first TFT Tr1 is doped with molybdenum (Mo) by MOCVD or ALD, the first active layer 641 may be doped with a large amount of molybdenum (Mo) having intermetallic bonds.

Also, when the first active layer 641 is doped with molybdenum (Mo) by sputtering, a large amount of oxidized molybdenum (Mo) may be doped.

Meanwhile, to measure the characteristics of the first TFT including the first active layer doped with molybdenum by MOCVD or ALD according to the aspects of the present disclosure and the TFT including the first active layer doped with molybdenum by sputtering, a drain current was measured while a gate voltage from −20 V to +20 V was applied. As shown in FIG. 9, a driving voltage Vdd of 0.1 V and a driving voltage of 10 V were applied to each of the first TFT including the first active layer doped with molybdenum by MOCVD or ALD according to the aspects of the present disclosure and the TFT including the first active layer doped with molybdenum by sputtering.

As shown in FIG. 9, the first TFT Tr1 doped with molybdenum (Mo) by MOCVD or ALD has a higher S parameter than the TFT doped with molybdenum (Mo) by sputtering.

In other words, the first active layer 641 which contains excess oxygen is doped with molybdenum (Mo) having unstable bonds (molybdenum (Mo)-molybdenum (Mo) bonds), and the molybdenum (Mo) acts as defects in the band gap. For this reason, when the first TFT Tr1 is turned on, the molybdenum (Mo) traps charge so that charge accumulation speed may be reduced. Consequently, the S parameter may be increased.

However, oxidized molybdenum which is in a stable state cannot trap charge in the band gap, and thus charge accumulation speed may be high, compared with the case of doping with molybdenum (Mo) having unstable bonds (molybdenum (Mo)-molybdenum (Mo) bonds). Accordingly, the S parameter may be reduced. In this case, however, there is a small number of defects in the band gap, and thus charge may be rapidly moved. Consequently, charge mobility may be high, compared with the case of doping with molybdenum (Mo) having unstable bonds (molybdenum (Mo)-molybdenum (Mo) bonds).

According to the aspects of the present disclosure, the first TFT Tr1 may be a driving transistor, which requires a high S parameter. Consequently, at least one active layer included in the first TFT Tr1 may be doped with molybdenum (Mo) by MOCVD or ALD.

As described above, when an active layer is doped with molybdenum (Mo) having intermetallic bonds, charge mobility is affected by the molybdenum (Mo). In other words, when the content of molybdenum (Mo) having intermetallic bonds in the active layer is significantly increased, the operation speed of the TFT may be drastically reduced.

Consequently, the first active layer 641 of the first TFT Tr1 which is a driving transistor may include a specific content of molybdenum (Mo).

This will be described below with reference to FIG. 11.

Figure 11:
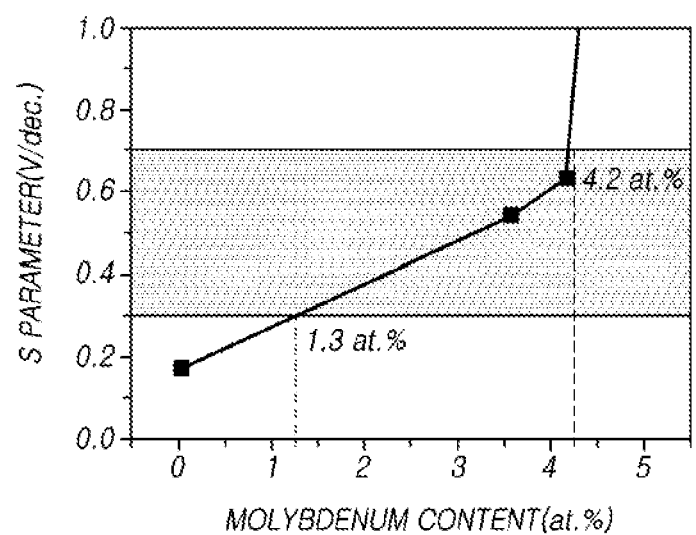
FIG. 11 is a graph showing the relationship between a molybdenum content in the first active layer of the first TFT and the S parameter.

FIG. 11 is a graph showing the relationship between a molybdenum (Mo) content in the first active layer of the first TFT and the S parameter.

Meanwhile, an appropriate S parameter of the driving transistor may be 0.3 to 0.7 V/dec.

When the S parameter of a driving transistor is less than 0.3 V/dec., representation of a low gray scale may be difficult in an electronic device which is a panel including the driving transistor. Also, when the S parameter of a driving transistor exceeds 0.7 V/dec., the operation speed of the driving transistor may be drastically reduced.

Referring to FIG. 11, when the S parameter of the first TFT Tr1 which is a driving transistor is 0.3 V/dec. to 0.7 V/dec., a molybdenum (Mo) content in the first active layer 641 may be 1.3 atomic percent (at. %) to 4.2 at. %. In this case, the first active layer 641 may include indium-gallium-zinc oxide (IGZO), and specifically, the indium-gallium-zinc oxide (IGZO) may be doped with molybdenum (Mo) at a content of 1.3 at. % to 4.2 at. %. The first active layer 641 may include indium, gallium, and zinc at a ratio of 1:1:1, but the present disclosure is not limited thereto.

Meanwhile, when each of the first and third active layers 641 and 643 in the first TFT Tr1 of FIG. 6 is doped with molybdenum (Mo), the overall first and third active layers 641 and 643 may be doped with molybdenum (Mo) at a content of 1.3 at. % to 4.2 at. %.

In this case, molybdenum (Mo) content per unit area may be small, compared with the case of doping only the first active layer 641 of the first TFT Tr1.

In other words, the content of molybdenum (Mo) doped into only the first active layer 641 of the first TFT Tr1 may correspond to the sum of contents of molybdenum (Mo) separately doped into the first and third active layers 641 and 643 of the first TFT Tr1.

In other words, one transistor may be doped with molybdenum (Mo) at a content of 1.3 at. % to 4.2 at. % regardless of the number of layers of the active layers, and in this way, the first TFT Tr1 which is a driving transistor may have an appropriate S parameter.

Also, referring to FIGS. 6 and 7, the light-shield layer 620 may be disposed under of the first TFT Tr1 which is a driving transistor.

The light-shield layer 620 may prevent light from being incident on the first and third active layers 641 and 643 of the first TFT Tr1.

When a plurality of second TFTs Tr2 are disposed in the electronic device according to the aspects of the present disclosure, the light-shield layer 620 may not be disposed under at least one second TFT Tr2.

The light-shield layer 620 may form a parasitic capacitance together with the second active layer 642 and the second gate electrode 672 of a second TFT Tr2. Since the parasitic capacitance may reduce the operation speed of the transistor, the light-shield layer 620 may not be disposed under the second TFT Tr2 which requires high operation speed according to the aspects of the present disclosure.

On the other hand, the first TFT Tr1, which is a driving transistor, continuously outputs a constant current, and thus it is important to prevent the first and third active layers 641 and 643 from being exposed to light so that the current characteristic may not be changed. For this reason, as shown in FIGS. 6 and 7, at least one light-shield layer 620 may be disposed under the first TFT Tr1 according to the aspects of the present disclosure.

Also, referring to FIGS. 6 and 7, the second active layer 642 of the second TFT Tr2, which is not a driving transistor, may not be doped with molybdenum (Mo). Therefore, as described above, the first active layer 641 of the first TFT Tr1 may have a higher molybdenum (Mo) content than the second active layer 642 of the second TFT Tr2.

As such, according to the aspects of the present disclosure, the active layer may be doped with molybdenum (Mo) to increase the S parameter of the first TFT Tr1.

It may be easier to adjust the content of molybdenum (Mo) than the content of other metals. When the active layer is doped with another metal (e.g., copper (Cu)), it may be difficult to dope the active layer at a content of 1.3 at. % to 4.2 at. %. Also, even when the active layer is doped with another metal at an adjusted content, it may be difficult to appropriately adjust the S parameter and mobility of the transistor due to drastic changes in the S parameter and mobility.

Subsequently, a structure of other transistors disposed in the electronic device according to the aspects of the present disclosure will be described below with reference to FIGS. 12 to 15.

Figure 12:
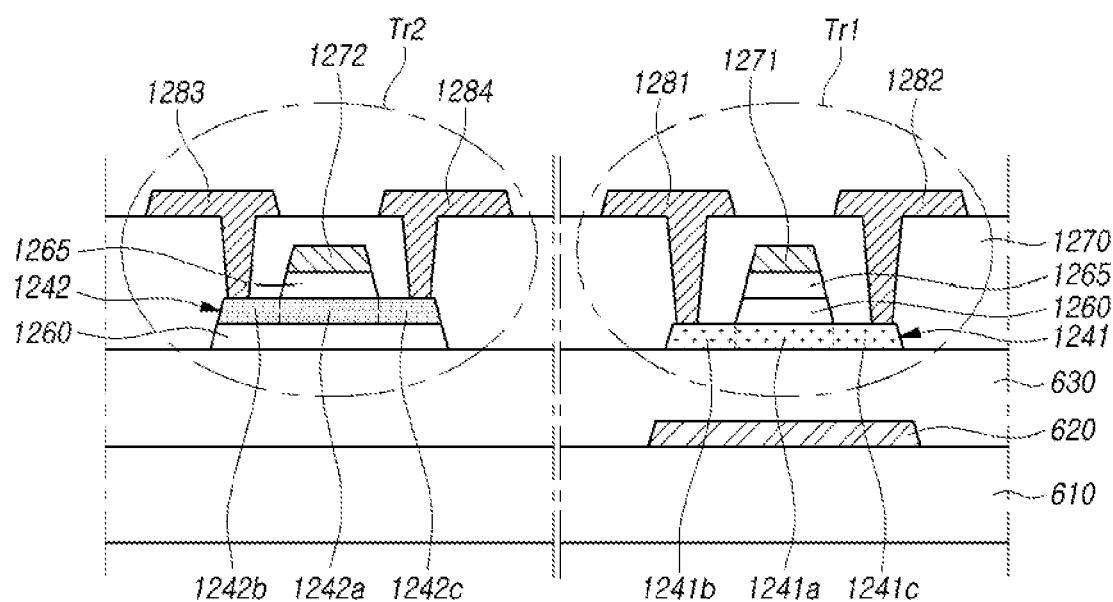
FIG. 12 is a cross-sectional view showing a structure of other TFTs disposed in the electronic device according to the aspects of the present disclosure.
Figure 13:
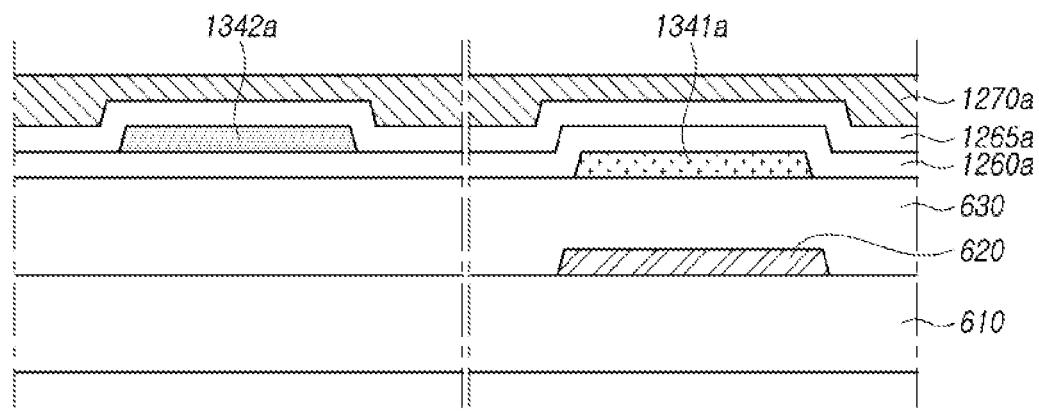
FIGS. 13 and 14 are cross-sectional views schematically showing operations for forming the TFTs shown in FIG. 12.
Figure 14:
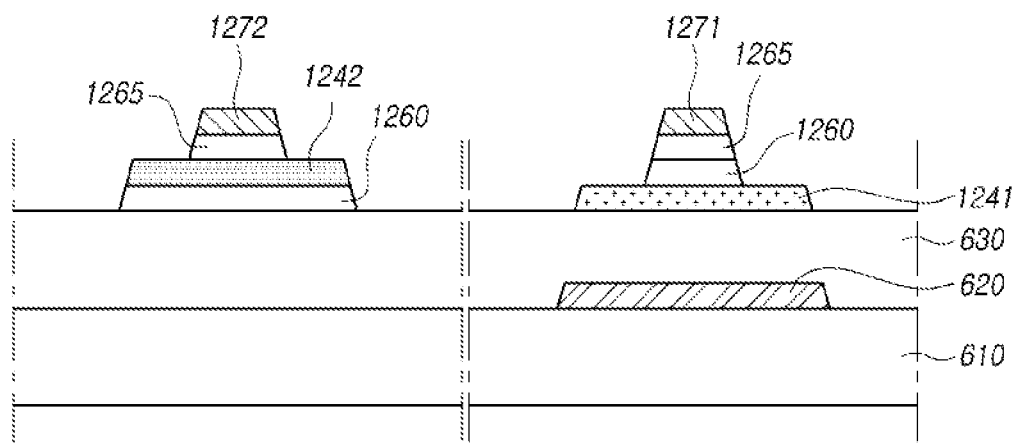
Figure 15:
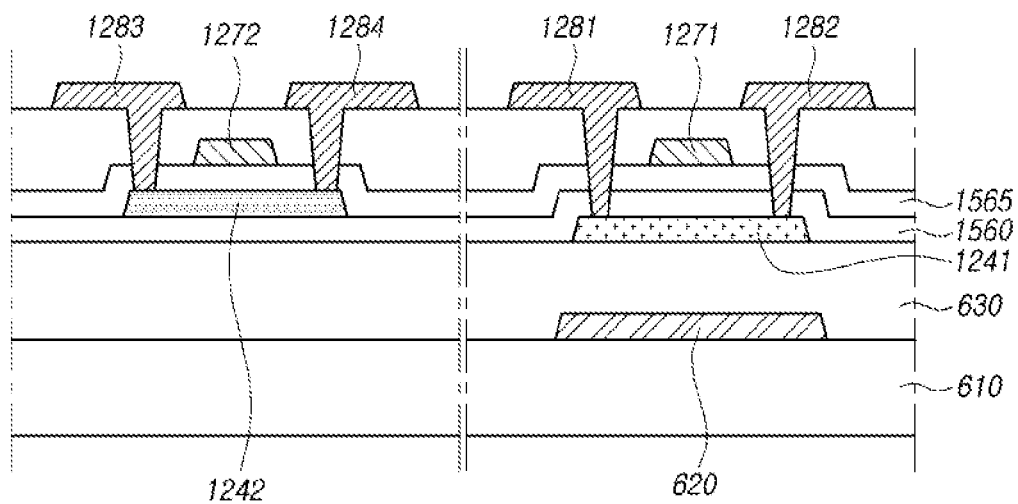
FIG. 15 is a cross-sectional view showing still another structure of TFTs disposed in the electronic device according to the aspects of the present disclosure.

FIG. 12 is a cross-sectional view showing a structure of other TFTs disposed in the electronic device according to the aspects of the present disclosure. FIGS. 13 and 14 are cross-sectional views schematically showing operations for forming the TFTs shown in FIG. 12. FIG. 15 is a cross-sectional view showing still another structure of TFTs disposed in the electronic device according to the aspects of the present disclosure.

In the following description, details (configuration, effects, etc.) which are the same as those of the above-described aspects may be omitted.

First, referring to FIG. 12, the electronic device according to the aspects of the present disclosure may include at least two TFTs Tr1 and Tr2, for example, a first TFT Tr1 and a second TFT Tr2 disposed on a substrate 610.

The first TFT Tr1 may include a first active layer 1241, a first gate electrode 1271, a first electrode 1281, and a second electrode 1282.

The second TFT Tr2 may include a second active layer 1242, a second gate electrode 1272, a third electrode 1283, and a fourth electrode 1284.

Specifically, a light-shield layer 620 and a buffer layer 630 may be sequentially disposed on the substrate 610.

The light-shield layer 620 may be disposed to overlap the first active layer 1241 of the first TFT Tr1.

The first active layer 1241 of the first TFT Tr1 may be disposed on the buffer layer 630. The first active layer 1241 may include molybdenum (Mo) at a content of 1.3 at. % to 4.2 at. %.

A first gate insulating film 1260 may be disposed on the substrate 610 on which the first active layer 1241 of the first TFT Tr1 is disposed.

The first gate insulating film 1260 may be disposed on the first active layer 1241 and disposed under the second active layer 1242 of the second TFT Tr2.

The first gate insulating film 1260 disposed on the first active layer 1241 may be disposed to expose a part of an upper surface of the first active layer 1241. Also, the first gate insulating film 1260 disposed under the second active layer 1242 may overlap all of the second active layer 1242.

A second gate insulating film 1265 may be disposed on the first gate insulating film 1260 which is disposed on the first active layer 1241 of the first TFT Tr1. The second gate insulating film 1265 may be disposed to expose a part of the upper surface of the first active layer 1241.

An area of the first active layer 1241 overlapping the first and second gate insulating films 1260 and 1265 may be a first channel area 1241a. An area of the first active layer 1241 exposed by (through) the first and second gate insulating films 1260 and 1265 may be a conductive area.

In other words, the first active layer 1241 may include a third area 1241b which is a conductive area and a fourth area 1241c which is a conductive area and spaced apart from the third area 1241b. The first channel area 1241a may be disposed between the third area 1241b and the fourth area 1241c. The first electrode 1281 may be electrically connected to the third area 1241b, and the second electrode 1282 may be electrically connected to the fourth area 1241c.

The second gate insulating film 1265 may be disposed on the second active layer 1242 of the second TFT Tr2.

The second gate insulating film 1265 disposed on the second active layer 1242 may be disposed to expose a part of an upper surface of the second active layer 1242.

An area of the second active layer 1242 overlapping the second gate insulating film 1265 may be a second channel area 1242a. Also, an area of the second active layer 1242 exposed by (through) the second gate insulating film 1265 may be a conductive area.

In other words, the second active layer 1242 may include a fifth area 1242b which is a conductive area and a sixth area 1242c which is a conductive area and spaced apart from the fifth area 1242b. The second channel area 1242a may be disposed between the fifth area 1242b and the sixth area 1242c. The third electrode 1283 may be electrically connected to the fifth area 1242b, and the fourth electrode 1284 may be electrically connected to the sixth area 1242c.

The first and second active layers 1241 and 1242 and the first and second gate insulating films 1260 and 1265 may be obtained through the following process.

Referring to FIG. 13, a first active layer pattern 1341a may be formed on the buffer layer 630. The first active layer pattern 1341a may be patterned by a masking process. The first active layer pattern 1341a may be doped with molybdenum (Mo).

Subsequently, a first gate insulating film material 1260a may be formed on the substrate 610 on which the first active layer pattern 1341a is formed.

On the first gate insulating film material 1260a, a second active layer pattern 1342a spaced apart from the first active layer pattern 1341a may be formed. The second active layer pattern 1342a may be patterned by a masking process.

A second gate insulating film material 1265a may be formed on the substrate 610 on which the second active layer pattern 1342a is disposed.

A gate electrode material 1270a may be formed on the second gate insulating film material 1265a.

Subsequently, as shown in FIGS. 13 and 14, the gate electrode material 1270a may be patterned by a masking process so that the first gate electrode 1271 and the second gate electrode 1272 may be formed to be spaced apart from each other.

Then, the first and second gate insulating film materials 1260a and 1265a are patterned using the second active layer pattern 1342a and the first and second gate electrodes 1271 and 1272 as masks so that the first and second gate insulating films 1260 and 1265 may be formed.

The first and second gate insulating film materials 1260a and 1265a may be patterned by a dry etching process.

During the process of dry-etching the first and second gate insulating film materials 1260a and 1265a, a portion of the first active layer pattern 1341a and a portion of the second active layer pattern 1342a may be made conductive so that the first active layer pattern 1341a and the second active layer pattern 1342a may become the first active layer 1241 and the second active layer 1242, respectively. Specifically, the first active layer pattern 1341a other than a portion covered by the first gate electrode 1271 may be made conductive. Also, the second active layer pattern 1342a other than a portion covered by the second gate electrode 1272 may be made conductive.

Meanwhile, FIGS. 12 to 14 show a structure in which the first and second gate insulating films 1260 and 1265 are patterned, but the present disclosure is not limited thereto.

For example, as shown in FIG. 15, a first gate insulating film 1560 may be disposed to cover the first active layer 1241 of the first TFT Tr1 in the active area A/A. Also, a second gate insulating film 1565 may be disposed on the first gate insulating film 1560 to cover the second active layer 1242 of the second TFT Tr2 in the active area A/A.

As shown in FIG. 12, the first gate electrode 1271 of the first TFT Tr1 may be disposed on the second gate insulating film 1265 disposed on the first active layer 1241 of the first TFT Tr1.

The first gate electrode 1271 and a portion of the first active layer 1241 may overlap each other. Also, the first and second gate insulating films 1260 and 1265 may be disposed between the first gate electrode 1271 and the first active layer 1241.

The second gate electrode 1272 of the second TFT Tr2 may be disposed on the second gate insulating film 1265 disposed on the second active layer 1242 of the second TFT Tr2.

The second gate electrode 1272 and a portion of the second active layer 1242 may overlap each other.

The thickness of the second gate insulating film 1265 disposed between the second gate electrode 1272 and the second active layer 1242 may be smaller than the sum of thicknesses of the first and second gate insulating films 1260 and 1265 disposed between the first gate electrode 1271 and the first active layer 1241.

In another aspect, the shortest distance between the upper surface of the first active layer 1241 of the first TFT Tr1 and the lower surface of the first gate electrode 1271 may be longer than the shortest distance between the upper surface of the second active layer 1242 of the second TFT Tr2 and the lower surface of the second gate electrode 1272.

According to the aspects of the present disclosure, the first TFT Tr1 may be a driving transistor, and the second TFT Tr2 may be another transistor which is not a driving transistor and is disposed in the electronic device.

As described above, the driving transistor requires a high S parameter.

Accordingly, the molybdenum (Mo) content in the first active layer 1241 of the first TFT Tr1 may be higher than the molybdenum (Mo) content in the second active layer 1242 of the second TFT Tr2.

Also, the S parameter of a transistor is related to the capacitance value of a gate insulating film. Specifically, the capacitance value of the gate insulating film is inversely proportional to the S parameter.

The capacitance value of the gate insulating film means a capacitance value per unit area formed by the gate electrode and the channel area of an active layer. The relationship among the capacitance value of the gate insulating film, the thickness of the gate insulating film, and the dielectric constant of the gate insulating film may be represented by Expression 1 below.

$$C_{INS} \propto \varepsilon_{INS}/T_{INS} \quad \text{[Expression 1]}$$

In Expression 1, CINS may be a capacitance value of a gate insulating film, TINS may be a thickness of the gate insulating film, and ε INS may be a dielectric constant of the gate insulating film.

According to Expression 1, the capacitance value of the gate insulating film interposed between the channel area of the active layer and the gate electrode is inversely proportional to the thickness of the gate insulating film. Also, a large thickness of the gate insulating film may lead to a large S parameter.

In other words, when the gate insulating film has a large thickness, the gate voltage slowly reaches the channel area compared with a case in which the gate insulating film has a small thickness. Consequently, the S parameter may be increased.

As described above, the S parameter may be adjusted by adjusting the thickness of the gate insulating film in an area overlapping the gate electrode.

In other words, the sum of thicknesses of the first and second gate insulating films 1260 and 1265 disposed between the first active layer 1241 and the first gate electrode 1271 in the structure of the first TFT Tr1, which is a driving transistor, is larger than the thickness of the second gate insulating film 1265 disposed between the second gate electrode 1272 and the second active layer 1242 of the second TFT Tr2 so that the S parameter of the first TFT Tr1 may be larger than the S parameter of the second TFT Tr2.

In other words, in the first TFT Tr1 according to the aspects of the present disclosure, the first active layer 1241 includes an appropriate molybdenum (Mo) content, and the first and second gate insulating films 1260 and 1265 are disposed between the first channel area 1241a of the first active layer 1241 and the first gate electrode 1271. Consequently, it is possible to obtain a high S parameter, and accordingly, it is possible to widen an available data voltage range.

An insulating film 1270 may be disposed on the substrate 610 on which the first and second gate electrodes 1271 and 1272 are disposed.

The first to fourth electrodes 1281 to 1284 may be disposed apart from each other on the insulating film 1270.

Specifically, the first electrode 1281 and the second electrode 1282 spaced apart from the first electrode 1281 of the first TFT Tr1 may be disposed on the insulating film 1270. Meanwhile, one of the first electrode 1281 and the second electrode 1282 of the first TFT Tr1 may be a source electrode of the first TFT Tr1, and the other may be a drain electrode.

Each of the first and second electrodes 1281 and 1282 of the first TFT Tr1 may be connected to a conductive area of the first active layer 1241 in the first TFT Tr1 through a contact hole provided in the insulating film 1270.

Also, the third electrode 1283 and the fourth electrode 1284 of the second TFT Tr2 may be disposed apart from each other on the insulating film 1270. Each of the third electrode 1283 and the fourth electrode 1284 of the second TFT Tr2 may be spaced apart from the first and second electrodes 1281 and 1282 of the first TFT Tr1. One of the third electrode 1283 and the fourth electrode 1284 of the second TFT Tr2 may be a source electrode of the second TFT Tr2, and the other may be a drain electrode.

Each of the third and fourth electrodes 1284 and 1284 of the second TFT Tr2 may be connected to a conductive area of the second active layer 1242 in the second TFT Tr2 through a contact hole provided in the insulating film 1270.

Subsequently, still another structure of transistors disposed in the electronic device according to the aspects of the present disclosure will be described below with reference to FIG. 16.

Figure 16:
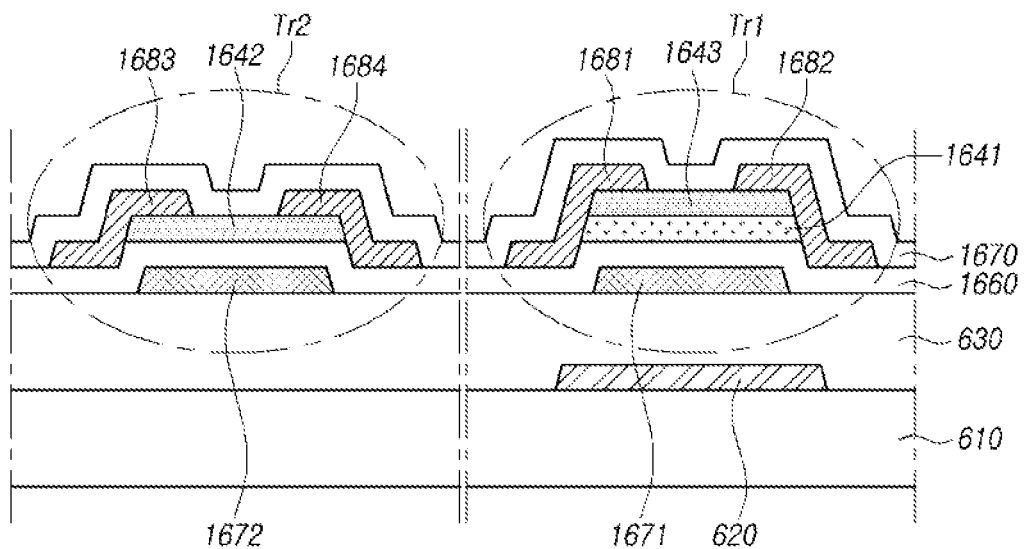
FIG. 16 is a cross-sectional view showing a structure of still other TFTs disposed in the electronic device according to the aspects of the present disclosure.

FIG. 16 is a cross-sectional view showing a structure of the still other TFTs disposed in the electronic device according to the aspects of the present disclosure.

In the following description, details (configuration, effects, etc.) which are the same as those of the above-described aspects may be omitted.

Referring to FIG. 16, the electronic device according to the aspects of the present disclosure may include first and second TFTs Tr1 and Tr2 disposed on a substrate 610.

The first TFT Tr1 may include a first active layer 1641, a third active layer 1643, a first gate electrode 1671, a first electrode 1681, and a second electrode 1682.

The second TFT Tr2 may include a second active layer 1642, a second gate electrode 1672, a third electrode 1683, and a fourth electrode 1684.

Specifically, a light-shield layer 620 and a buffer layer 630 may be sequentially disposed on the substrate 610.

The light-shield layer 620 may be disposed to overlap the first and third active layers 1641 and 1643 of the first TFT Tr1.

The first gate electrode 1671 of the first TFT Tr1 and the second gate electrode 1672 of the second TFT Tr2 may be disposed apart from each other on the buffer layer 630.

A first gate insulating film 1660 may be disposed on the first and second gate electrodes 1671 and 1672.

The first active layer 1641 of the first TFT Tr1 and the second active layer 1642 of the second TFT Tr2 may be disposed on the first gate insulating film 1660. The first active layer 1641 may overlap the first gate electrode 1671, and the second active layer 1642 may overlap the second gate electrode 1672.

The third active layer 1643 may be disposed on the first active layer 1641 of the first TFT Tr1.

At least one of the first active layer 1641 and the third active layer 1643 of the first TFT Tr1 may include molybdenum (Mo) at a content of 1.3 at. % to 4.2 at. %.

The second active layer 1642 of the second TFT Tr2 may include a lower molybdenum (Mo) content than an active layer including molybdenum (Mo) between the first and third active layers 1641 and 1643 of the first TFT Tr1.

Therefore, the S parameter of the first TFT Tr1 may be higher than the S parameter of the second TFT Tr2.

The first electrode 1681 and the second electrode 1682 may be disposed apart from each other on the third active layer 1643 and the first gate insulating film 1660 of the first TFT Tr1. Each of the first and second electrodes 1681 and 1682 may also come into contact with one side surface of each of the first active layer 1641 and the third active layer 1643.

The third electrode 1683 and the fourth electrode 1684 may be disposed apart from each other on the second active layer 1642 and the first gate insulating film 1660 of the second TFT Tr2. Each of the third and fourth electrodes 1683 and 1684 may also come into contact with one side surface of the second active layer 1642.

An insulating film 1670 may be disposed on the substrate 610 on which the first to fourth electrodes 1681 to 1684 are disposed.

Subsequently, the characteristics of TFTs corresponding to Comparative Example, Aspect 1, and Aspect 2 will be described below with reference to FIG. 17.

Figure 17:
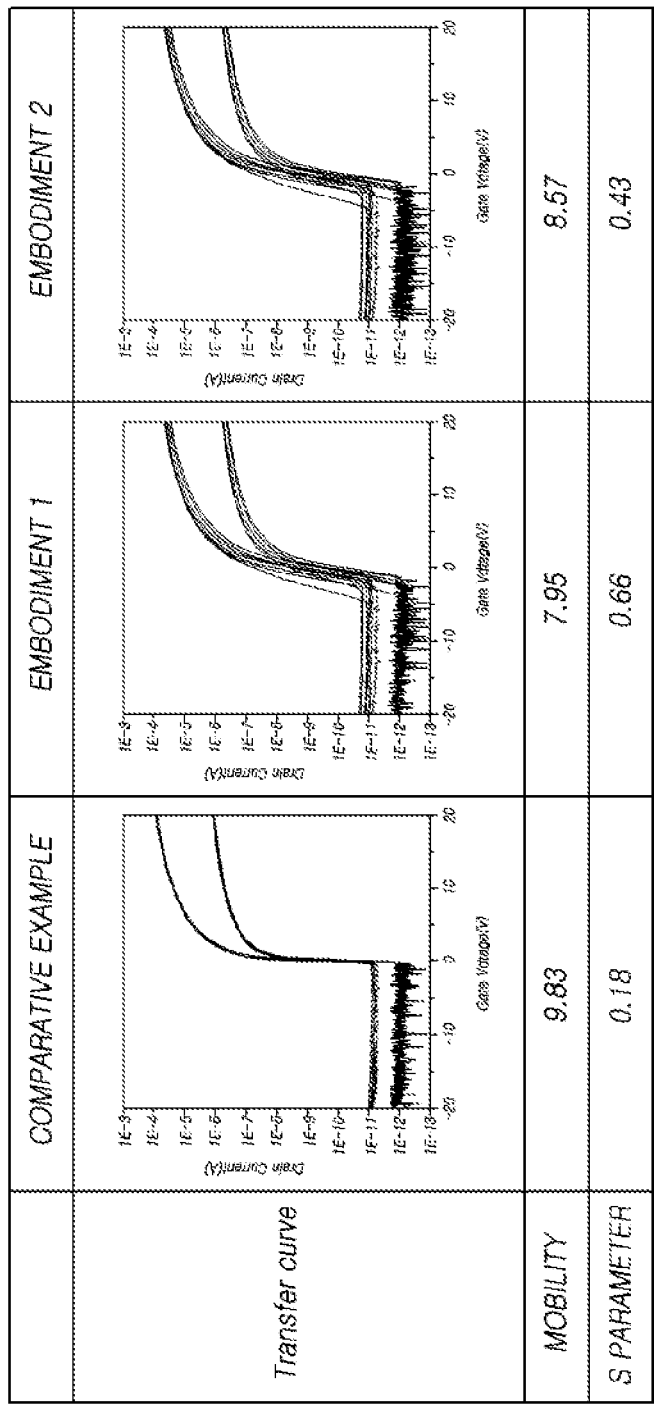
FIG. 17 is a table showing transfer curves, mobility, and S parameters of TFTs of Comparative Example, Aspect 1, and Aspect 2.

FIG. 17 is a table showing transfer curves, mobility, and S parameters of TFTs of Comparative Example, Aspect 1, and Aspect 2.

The TFT of Comparative Example may include an active layer (IGZO) which is not doped with molybdenum (Mo) and has a thickness of 300 Å and may have a structure corresponding to the second TFT of FIG. 6.

The TFT of Aspect 1 may include an active layer (IGZO) which is doped with molybdenum (Mo) and has a thickness of 300 Å and may have a structure corresponding to the second TFT of FIG. 6.

In the TFT of Aspect 2, only an active layer disposed in a lower portion of the structure of FIG. 6 may be doped with molybdenum (Mo).

Conditions for measuring a change in the drain current of each of the TFTs of Comparative Example, Aspect 1, and Aspect 2 versus a change in the gate voltage may be identical to the conditions described with reference to FIGS. 9 and 10. Specifically, to measure the characteristics of the TFTs of Comparative Example, Aspect 1, and Aspect 2, a drain current was measured while a gate voltage from −20 V to +20 V is applied, and a driving voltage Vdd of 0.1 V and a driving voltage of 10 V were applied to each of the TFTs of Comparative Example, Aspect 1, and Aspect 2.

Referring to FIG. 17, the TFTs of Aspect 1 and Aspect 2 have a slightly lower mobility than the TFT of Comparative Example but have higher S parameters than the TFT of Comparative Example.

In other words, a TFT having an active layer doped with molybdenum (Mo) may have an increased S parameter while mobility is not significantly degraded. Consequently, the TFT is appropriate for a driving transistor.

Also, the TFT of Comparative Example having an active layer which is not doped with molybdenum (Mo) has high charge mobility and thus is appropriate for signal transfer.

Referring to the transfer curves, it can be seen that points at which the gate voltages of the TFTs according to Aspects are zero (turn-on voltages Von) are shifted in the negative (−) direction compared to the turn-on voltage of the TFT according to Comparative Example.

Accordingly, it can be seen that the gradients of the graphs are reduced around the gate voltage of 0. Here, a reduction in the gradient may denote an increase in the S parameter. In other words, since the active layer includes molybdenum (Mo), the S parameter is increased.

As described above, in the electronic device according to the aspects of the present disclosure, a plurality of transistors may have structures appropriate for individual functions.

Specifically, according to the aspects of the present disclosure, it is possible to provide a TFT array substrate in which at least one of a plurality of TFTs disposed on a substrate includes molybdenum (Mo) in an active layer and thus has a high S parameter, and an electronic device including the TFT array substrate.

Also, according to the aspects of the present disclosure, it is possible to provide a TFT array substrate in which at least one of a plurality of TFTs disposed on a substrate has sufficient mobility and thus facilitates signal transfer, and an electronic device including the TFT array substrate.

The above description has been presented to enable any person skilled in the art to make and use the technical idea of the present disclosure and has been provided in the context of a particular application and its requirements. Various modifications, additions, and substitutions to the described aspects will be readily apparent to those skilled in the art, and the general principles defined herein may be applied to other aspects and applications without departing from the spirit and scope of the present disclosure. The above description and the accompanying drawings provide an example of the technical idea of the present disclosure for illustrative purposes only. That is, the disclosed aspects are intended to illustrate the scope of the technical idea of the present disclosure. Thus, the scope of the present disclosure is not limited to the aspects shown but is to be accorded the widest scope consistent with the claims. The scope of protection of the present disclosure should be construed based on the following claims, and all technical ideas within the scope of equivalents thereof should be construed as being included within the scope of the present disclosure.

What is claimed is:

1. An electronic device comprising:
    a panel including a substrate;
    a buffer layer disposed on the substrate;
    at least one first thin film transistor disposed on the buffer layer and comprising a first active layer being an oxide semiconductor layer including molybdenum at a content of 1.3 to 4.2 atomic percent (at. %) and a first gate electrode;
    at least one second thin film transistor disposed on the buffer layer and comprising a second gate electrode and a second active layer being an oxide semiconductor layer, and spaced apart from the first active layer;
    a first gate insulating film overlapping with the first active layer and the second active layer;
    a first gate electrode of the first thin film transistor overlapping with the first gate insulating film and a part of the first active layer;
    a second gate electrode of the second thin film transistor overlapping with the first gate insulating film, spaced apart from the first gate electrode and overlapping with a part of the second active layer; and
    a driving circuit configured to drive the panel.

2. The electronic device of claim 1, wherein the oxide semiconductor layer of the first active layer is formed of at least one selected from a group consisting of an oxide of a zinc (Zn), indium (In), gallium (Ga), tin (Sn), titanium (Ti), and molybdenum (Mo), or a combination of a metal, such as zinc (Zn), indium (In), gallium (Ga), tin (Sn), titanium (Ti), and molybdenum (Mo), and an oxide thereof, and
    wherein the oxide semiconductor layer of the second active layer is formed of at least one selected from a group consisting of an oxide of zinc (Zn), indium (In), gallium (Ga), tin (Sn), and titanium (Ti), or a combination of zinc (Zn), indium (In), gallium (Ga), tin (Sn), and titanium (Ti), and an oxide thereof.

3. The electronic device of claim 1, wherein the first thin film transistor is a driving transistor disposed in an active area of the panel, and
    wherein the second thin film transistor is a switching transistor disposed in the active area of the panel or a pull-up transistor or a pull-down transistor disposed in a non-active area surrounding the active area of the panel.

4. The electronic device of claim 1, further comprising at least one light-shield layer overlapping the first active layer under the first active layer.

5. The electronic device of claim 1, wherein the first thin film transistor further includes a third active layer disposed on the first active layer, and
    wherein the first gate insulating film is disposed on the third active layer, and the first gate electrode is disposed on the first gate insulating film.

6. The electronic device of claim 5, wherein the third active layer has a molybdenum content being equal to or less than a molybdenum content of the first active layer.

7. The electronic device of claim 5, further comprising an insulating film disposed on the first gate electrode,
    wherein the first thin film transistor further includes a first electrode and a second electrode which are spaced apart from each other on the insulating film, and wherein the first electrode is connected to a first area of the third active layer which is made conductive, and the second electrode is connected to a second area of the third active layer which is spaced apart from the first area and made conductive.

8. The electronic device of claim 5, wherein the first gate insulating film is disposed on the second active layer of the second thin film transistor, and
wherein the second gate electrode is disposed on the first gate insulating film.

9. The electronic device of claim 8, wherein the first gate insulating film overlaps with a part of each of the first and third active layers of the first thin film transistor and overlaps with a part of the second active layer of the second thin film transistor.

10. The electronic device of claim 8, wherein further comprising an insulating film disposed on the second gate electrode,
wherein the second thin film transistor further includes a third electrode and a fourth electrode which are disposed apart from each other on the insulating film, and each of the third and fourth electrodes is connected to the second active layer.

11. The electronic device of claim 1, further comprising a second gate insulating film disposed on the first gate insulating film and the second active layer,
wherein the first gate insulating film is disposed on the first active layer of the first thin film transistor and under the second active layer of the second thin film transistor, and
wherein the first gate electrode and the second gate electrode are disposed on the second gate insulating film.

12. The electronic device of claim 11, further comprising an insulating film disposed on the first and second gate electrodes,
wherein the first thin film transistor further includes a first electrode and a second electrode which are disposed apart from each other on the insulating film,
wherein the first electrode is connected to a third area of the first active layer which is made conductive, and
wherein the second electrode is connected to a fourth area of the first active layer which is spaced apart from the third area and made conductive.

13. The electronic device of claim 11, further comprising an insulating film disposed on the first and second gate electrodes,
wherein the second thin film transistor further includes a third electrode and a fourth electrode which are disposed apart from each other on the insulating film,
wherein the third electrode is connected to a fifth area of the second active layer which is made conductive, and
wherein the fourth electrode is connected to a sixth area of the second active layer which is spaced apart from the fifth area and made conductive.

14. The electronic device of claim 11, wherein the first gate insulating film overlaps with a part of the first active layer of the first thin film transistor and all of the second active layer of the second thin film transistor, and wherein the second gate insulating film overlaps a part of the first active layer of the first thin film transistor and a part of the second active layer of the second thin film transistor.

15. The electronic device of claim 11, wherein a shortest distance between an upper surface of the first active layer of the first thin film transistor and a lower surface of the first gate electrode is greater than a shortest distance between an upper surface of the second active layer of the second thin film transistor and a lower surface of the second gate electrode.

16. The electronic device of claim 1, wherein the first gate electrode of the first thin film transistor is disposed on the buffer layer,
wherein the first gate insulating film is disposed on the first gate electrode,
wherein the first active layer is disposed on the first gate insulating film, and
wherein the first thin film transistor includes a third active layer disposed on the first active layer.

17. The electronic device of claim 16, wherein the third active layer has a molybdenum content being less than or equal to a molybdenum content of the first active layer.

18. The electronic device of claim 16, wherein the first thin film transistor includes a first electrode and a second electrode which are disposed on the third active layer and the first gate insulating film and spaced apart from each other.

19. The electronic device of claim 16, wherein the second gate electrode of the second thin film transistor is disposed on the buffer layer, and
wherein the first gate insulating film is disposed on the second gate electrode, and the second active layer is disposed on the first gate insulating film.

20. The electronic device of claim 19, wherein the second thin film transistor includes a third electrode and a fourth electrode which are disposed on the second active layer and the first gate insulating film and spaced apart from each other.

21. A thin film transistor array substrate comprising:
a substrate;
a buffer layer disposed on the substrate;
a first thin film transistor having a first active layer which is an oxide semiconductor layer including molybdenum at a content of 1.3 to 4.2 atomic percent (at. %) and disposed on the buffer layer;
a second thin film transistor having a second active layer which is an oxide semiconductor layer and disposed on the buffer layer to be spaced apart from the first active layer of the first thin film transistor;
a first gate insulating film overlapping with the first active layer and the second active layer;
a first gate electrode of the first thin film transistor overlapping with the first gate insulating film and a part of the first active layer; and
a second gate electrode of the second thin film transistor overlapping with the first gate insulating film, spaced apart from the first gate electrode, and overlapping with a part of the second active layer.

* * * * *